United States Patent
Tanaka et al.

(10) Patent No.: US 11,587,925 B2
(45) Date of Patent: Feb. 21, 2023

(54) VARIABLE CAPACITANCE CIRCUIT, CIRCUIT DEVICE, AND OSCILLATOR

(71) Applicant: Seiko Epson Corporation, Tokyo (JP)

(72) Inventors: Atsushi Tanaka, Minowa (JP); Teppei Higuchi, Chino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/590,840

(22) Filed: Feb. 2, 2022

(65) Prior Publication Data
US 2022/0246605 A1    Aug. 4, 2022

(30) Foreign Application Priority Data
Feb. 3, 2021    (JP) ................ JP2021-015509

(51) Int. Cl.
| | |
|---|---|
| *H01L 27/06* | (2006.01) |
| *H03H 9/05* | (2006.01) |
| *H03H 9/10* | (2006.01) |
| *H01L 49/02* | (2006.01) |
| *H03B 5/36* | (2006.01) |
| *H03H 9/19* | (2006.01) |

(52) U.S. Cl.
CPC .......... *H01L 27/0629* (2013.01); *H01L 28/60* (2013.01); *H03B 5/36* (2013.01); *H03H 9/0547* (2013.01); *H03H 9/1021* (2013.01); *H03H 9/19* (2013.01); *H03B 2200/004* (2013.01)

(58) Field of Classification Search
CPC .................................................. H01L 27/0629
USPC ........................................................ 331/116 R
See application file for complete search history.

(56) References Cited

U.S. PATENT DOCUMENTS

| | | | |
|---|---|---|---|
| 7,403,147 B2* | 7/2008 | Klaassen | H03M 1/0612 341/150 |
| 2006/0007338 A1 | 1/2006 | Wakano et al. | |
| 2009/0021332 A1* | 1/2009 | Brekelmans | H01L 27/0805 334/55 |
| 2016/0126934 A1* | 5/2016 | De Jongh | H03J 5/244 334/55 |
| 2018/0254779 A1* | 9/2018 | Omran | H03M 1/38 |

FOREIGN PATENT DOCUMENTS

JP    2006-032374 A    2/2006

* cited by examiner

*Primary Examiner* — Joseph Chang
(74) *Attorney, Agent, or Firm* — Harness, Dickey & Pierce, P.L.C.

(57) ABSTRACT

A variable capacitance circuit includes a capacitor array having a first capacitor in which a plurality of MIM capacitors are coupled in parallel and a second capacitor in which a plurality of MIM capacitors are coupled in series, and a switch array having a first switch and a second switch. A shape pattern of at least one of a first electrode of the first capacitor, a first ground shield, a second electrode of the second capacitor, and a second ground shield is set so that a first capacitance difference per 1 LSB between first capacitance values of the first capacitor when the first switch is turned on and off and a second capacitance difference per 1 LSB between second capacitance values of the second capacitor when the second switch is turned on and off are close to each other.

14 Claims, 19 Drawing Sheets

FIG. 15

| | C18~C8 (16C) | C7 (8C) | C6 (4C) | C5 (2C) | C4 (1C) | C3 ($\frac{1}{2}$C) | C2 ($\frac{1}{4}$C) | C1 ($\frac{1}{8}$C) |
|---|---|---|---|---|---|---|---|---|
| WHEN SWITCH IS TURNED ON [fF] | 1877.20 | 938.30 | 468.86 | 234.42 | 117.62 | 52.50 | 26.28 | 16.02 |
| WHEN SWITCH IS TURNED OFF [fF] | 243.99 | 121.78 | 60.32 | 30.58 | 16.08 | 16.93 | 9.33 | 11.40 |
| CAPACITANCE DIFFERENCE OF 1LSB [fF] | 12.76 | 12.76 | 12.77 | 12.74 | 12.69 | 8.89 | 8.48 | 4.62 |

PARALLEL COUPLING MIM — FIRST CAPACITANCE DIFFERENCE

SERIES COUPLING MIM — SECOND CAPACITANCE DIFFERENCE

VARIABLE CAPACITANCE CIRCUIT, CIRCUIT DEVICE, AND OSCILLATOR

The present application is based on, and claims priority from JP Application Serial Number 2021-015509, filed Feb. 3, 2021, the disclosure of which is hereby incorporated by reference herein in its entirety.

BACKGROUND

1. Technical Field

The present disclosure relates to a variable capacitance circuit, a circuit device, an oscillator, or the like.

2. Related Art

In related art, a variable capacitance circuit using a metal-insulator-metal (MIM) capacitor has been known. For example, JP-A-2006-032374 discloses a capacitor array using an MIM capacitor.

When a variable capacitance circuit is realized by a capacitor array using a MIM capacitor as in JP-A-2006-032374, there is a problem that the linearity of the capacitance value change in the variable capacitance circuit deteriorates due to a parasitic capacitance between the capacitor, the electrode, and the ground.

SUMMARY

An aspect of the present disclosure relates to a variable capacitance circuit whose capacitance value is variably controlled based on control data, and which includes a capacitor array including a plurality of capacitors, and a switch array having a plurality of switches that are turned on or off based on the control data and provided in series with the capacitor array between a first node and a ground node, in which the capacitor array includes a first capacitor in which a plurality of metal-insulator-metal (MIM) capacitors are coupled in parallel, and a second capacitor in which a plurality of MIM capacitors are coupled in series, the switch array includes a first switch coupled in series with the first capacitor between the first node and the ground node and a second switch coupled in series with the second capacitor between the first node and the ground node, and when a capacitance value between the first node and the ground node due to the first capacitor and a parasitic capacitance of the first capacitor is defined as a first capacitance value, and a capacitance value between the first node and the ground node due to the second capacitor and a parasitic capacitance of the second capacitor is defined as a second capacitance value, in plan view, a shape pattern of at least one of a first electrode that is an electrode of the first capacitor, a first ground shield surrounding the first capacitor, a second electrode that is an electrode of the second capacitor, and a second ground shield surrounding the second capacitor is set so that a first capacitance difference per 1 LSB of the control data between the first capacitance value when the first switch is turned on and the first capacitance value when the first switch is turned off and a second capacitance difference per 1 LSB of the control data between the second capacitance value when the second switch is turned on and the second capacitance value when the second switch is turned off are close to each other.

Another aspect of the present disclosure relates to a variable capacitance circuit whose capacitance value is variably controlled based on control data, and which includes a capacitor array including a plurality of capacitors, and a switch array having a plurality of switches that are turned on or off based on the control data and provided in series with the capacitor array between a first node and a ground node, in which the capacitor array includes a first capacitor in which a plurality of MIM capacitors are coupled in parallel, and a second capacitor in which a plurality of MIM capacitors are coupled in series, the switch array includes a first switch coupled in series with the first capacitor between the first node and the ground node and a second switch coupled in series with the second capacitor between the first node and the ground node, and in the plan view, when a distance in a first direction between a first electrode of the first capacitor and a first ground shield surrounding the first capacitor is defined as LA1 and a distance in the first direction between a second electrode of the second capacitor and a second ground shield surrounding the second capacitor is defined as LA2, LA2>LA1.

Another aspect of the present disclosure relates to a circuit device including the variable capacitance circuit described above and an oscillation circuit whose oscillation frequency is controlled by the capacitance value of the variable capacitance circuit, in which the first node is an oscillation node of the oscillation circuit.

Another aspect of the present disclosure relates to an oscillator including the circuit device described above and a resonator that oscillates by being driven by the oscillation circuit.

BRIEF DESCRIPTION OF THE DRAWINGS

FIG. 15 is an example of a capacitance value and a capacitance difference between a parallel coupling MIM capacitor and a series coupling MIM capacitor.

DESCRIPTION OF EXEMPLARY EMBODIMENTS

Hereinafter, a present embodiment will be described. The present embodiment described below does not unreasonably limit the description of the scope of the claims. Moreover, not all of the configurations described in the present embodiment are essential configuration requirements.

1. Variable Capacitance Circuit

Figure 1:
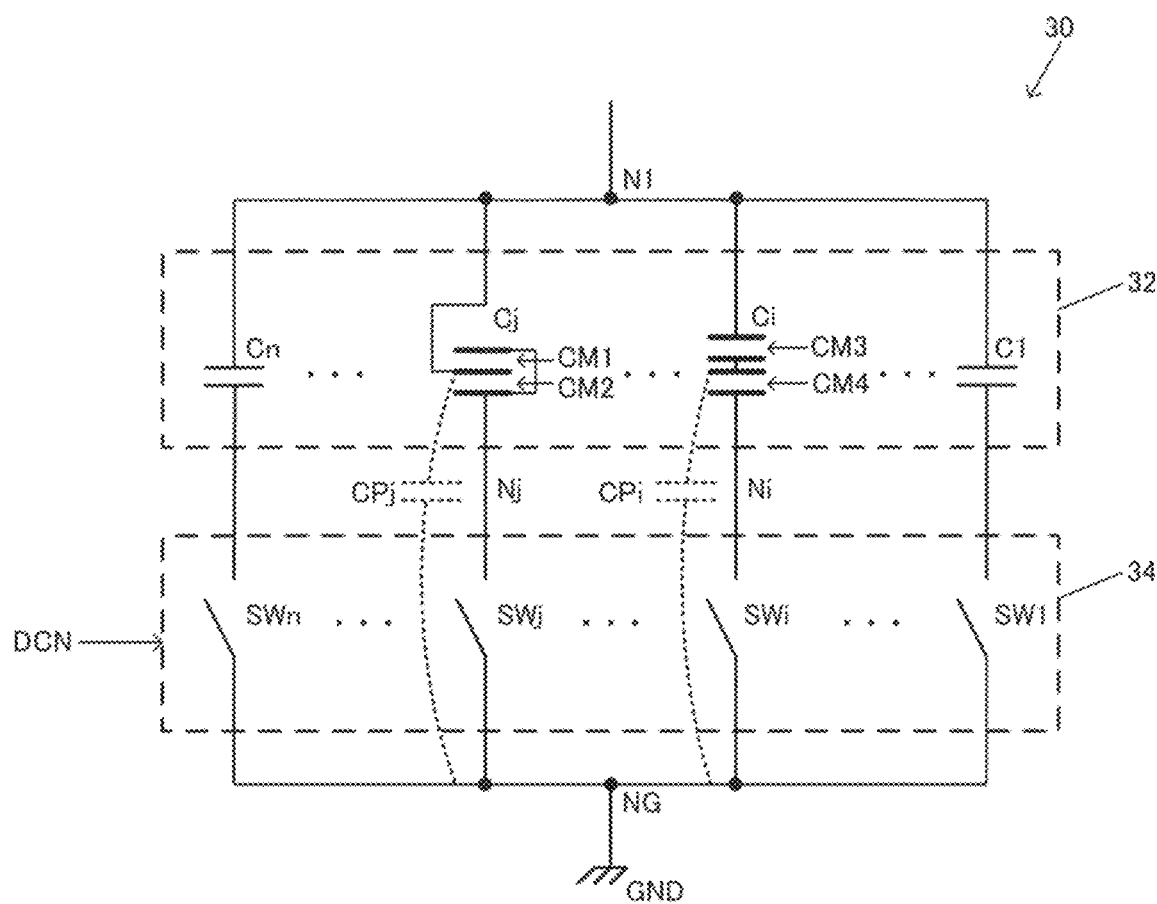
FIG. 1 is a configuration example of a variable capacitance circuit according to the present embodiment.

FIG. 1 illustrates a configuration example of a variable capacitance circuit 30 of the present embodiment. The variable capacitance circuit 30 whose capacitance value is variably controlled based on control data DCN includes a capacitor array 32 and a switch array 34. Specifically, the variable capacitance circuit 30 includes the capacitor array 32 including a plurality of capacitors Cn to C1, and the switch array 34 including a plurality of switches SWn to SW1 that are turned on or off based on the control data DCN and provided in series with the capacitor array 32 between a first node N1 and a ground node NG. For example, the capacitor Cn and the switch SWn, the first capacitor Cj and the first switch SWj, the second capacitor Ci and the second switch SWi, and the capacitor C1 and the switch SW1 are provided in series between the first node N1 and the ground node NG. Here, i and j are different integers of 1 or more and n or less.

The capacitor array 32 includes the first capacitor Cj in which a plurality of MIM capacitors are coupled in parallel and the second capacitor Ci in which a plurality of MIM capacitors are coupled in series. The MIM capacitor is a capacitor with a Metal-Insulator-Metal structure. For example, in the first capacitor Cj, MIM capacitors CM1 and CM2 are coupled in parallel as the plurality of MIM capacitors. In the second capacitor Ci, MIM capacitors CM3 and CM4 are coupled in series as the plurality of MIM capacitors. In FIG. 1, in the first capacitor Cj, the two MIM capacitors CM1 and CM2 are coupled in parallel, but the number of MIM capacitors coupled in parallel may be 3 or more. Further, in the second capacitor Ci, two MIM capacitors CM3 and CM4 are coupled in series, but the number of MIM capacitors coupled in series may be 3 or more.

Further, the switch array 34 includes the first switch SWj coupled in series with the first capacitor Cj between the first node N1 and the ground node NG, and the second switch SWi coupled in series with the second capacitor Ci between the first node N1 and the ground node NG. In FIG. 1, a configuration is provided such that the switches SWn to SW1 are provided on the side of the ground node NG and the capacitors Cn to C1 are provided on the side of the first node N1, but a configuration may be provided such that the capacitors Cn to C1 are provided on the side of the ground node NG and the switches SWn to SW1 are provided on the side of the first node Nl.

Figure 2:
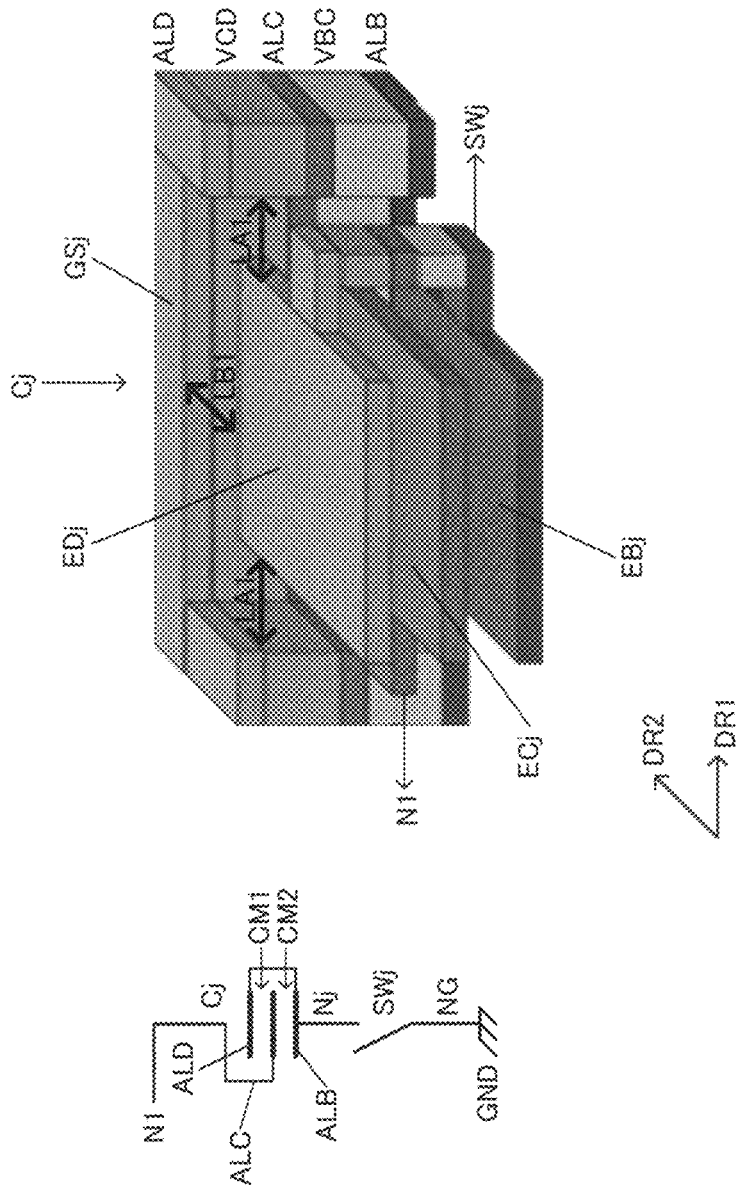
FIG. 2 is an example of a parallel coupling MIM capacitor.

FIG. 2 illustrates a configuration example of the first capacitor Cj. The first capacitor Cj includes the MIM capacitors CM1 and CM2 stacked and coupled in parallel in the direction in plan view. The MIM capacitor CM1 is the first MIM capacitor, and the MIM capacitor CM2 is the second MIM capacitor. The direction in plan view is a direction orthogonal to a substrate of a semiconductor chip, which is a circuit device 20 of FIG. 23, which will be described later. As illustrated in FIG. 2, the first capacitor Cj has a configuration in which the MIM capacitors CM1 and CM2 coupled in parallel are vertically stacked in the direction in plan view. The first capacitor Cj has first electrodes EDj, ECj, and EBj. The first electrodes EDj, ECj, and EBj are formed by metal layers ALD, ALC, and ALB, respectively. The ALD is the upper metal layer, the ALB is the lower metal layer, and ALC is the metal layer between the ADL and the ALB. The metal layers ALD, ALC, and ALB are each, for example, a metal layer such as aluminum or an aluminum alloy. In FIG. 2, electrodes TP1 and TP2 of FIG. 6, which will be described later, are not illustrated. The first electrode ECj of the first capacitor Cj is coupled to the first node N1, and the first electrodes EDj and EBj are coupled to the other end of the first switch SWj whose one end is coupled to the ground node NG. That is, the first electrodes EDj and EBj are coupled to the node Nj which is the other end node of the first switch SWj.

Figure 4:
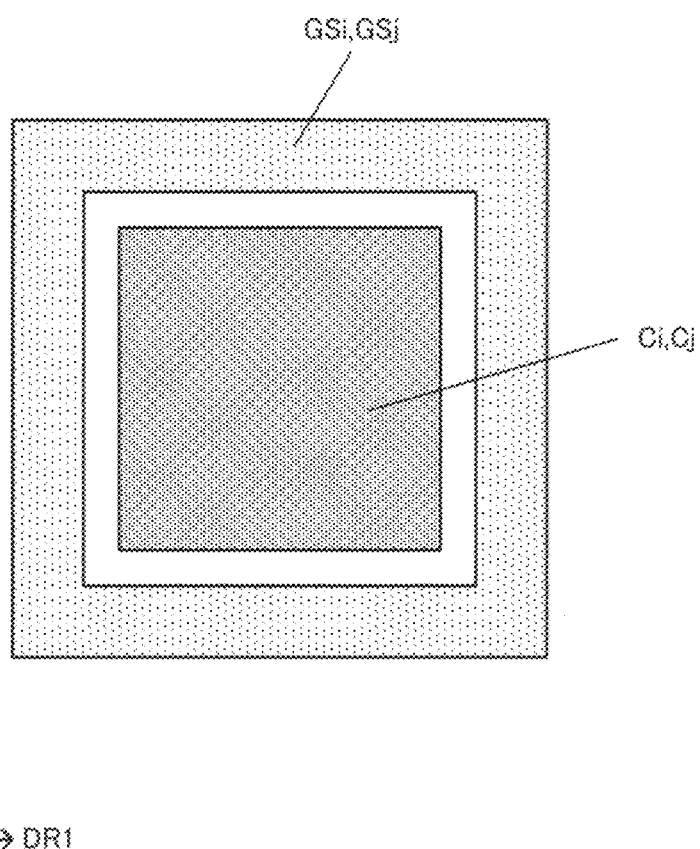
FIG. 4 is an explanatory view of a ground shield.

A first ground shield GSj set to a ground voltage is provided around the first capacitor Cj. Specifically, as illustrated in FIG. 4, the first ground shield GSj is provided to surround the first capacitor Cj. The first ground shield GSj is formed by the metal layer ALD, ALC, and ALB, a via contact VCD coupling the metal layer ALC and the metal layer ALD, and a via contact VBC coupling the metal layer ALB and the metal layer ALC. Although the first ground shield GSj surrounds the entire circumference of the first capacitor Cj in FIG. 4, the present embodiment is not limited thereto, and there may be an area in which the first ground shield GSj is not present in a portion of the entire circumference.

In FIG. 2, the distance between the first ground shield GSj and the first electrodes EDj, ECj, and EBj, which are the electrodes of the first capacitor Cj, in a first direction DR1 is defined as LA1. Further, the distance between the first ground shield GSj and the first electrodes EDj, ECj, and EBj in a second direction DR2 orthogonal to the first direction DR1 is defined as LB1. For example, the first direction is the X direction and the second direction is the Y direction. In this case, the direction in plan view is the Z direction. The number of MIM capacitors coupled in parallel in the first capacitor Cj is not limited to 2, and may be 3 or more.

Figure 3:
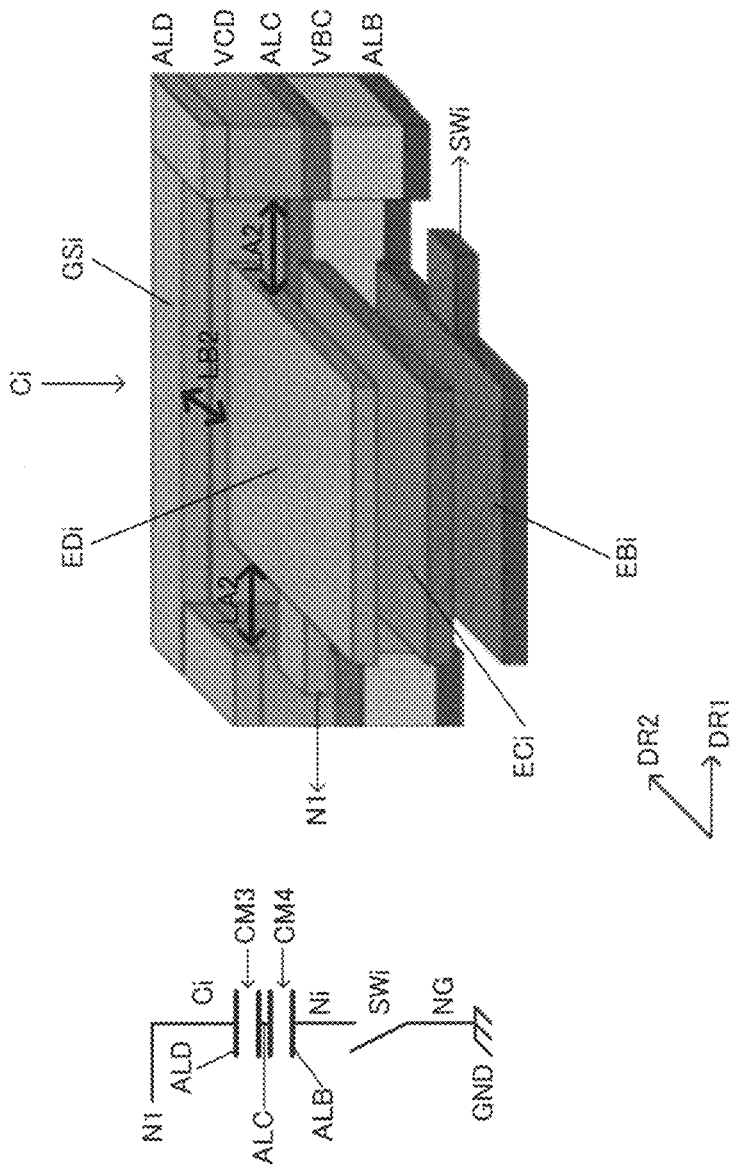
FIG. 3 is an example of a series coupling MIM capacitor.

FIG. 3 illustrates a configuration example of the second capacitor Ci. The second capacitor Ci includes the MIM capacitors CM3 and CM4 stacked and coupled in series in the direction in plan view. The MIM capacitor CM3 is a third MIM capacitor, and the MIM capacitor CM4 is a fourth MIM capacitor. As illustrated in FIG. 3, the second capacitor Ci has a configuration in which the MIM capacitors CM3 and CM4 coupled in series are vertically stacked in the direction in plan view. The second capacitor Ci has second electrodes EDi, ECi, and EBi. The second electrodes EDi, ECi, and EBi are formed by the metal layers ALD, ALC, and ALB, respectively. In FIG. 3, electrodes TP3 and TP4 of FIG. 7, which will be described later, are not illustrated. The second electrode EDi of the second capacitor Ci is coupled to the first node N1, and the second electrode EBi is coupled to the other end of the second switch SWi whose one end is coupled to the ground node NG. That is, the second electrode EBi is coupled to a node Ni, which is the other end node of the second switch SWi.

A second ground shield GSi set to the ground voltage is provided around the second capacitor Ci. Specifically, as illustrated in FIG. 4, the second ground shield GSi is provided to surround the second capacitor Ci. The second ground shield GSi is formed by the metal layers ALD, ALC, and ALB, the via contact VCD coupling the metal layers ALC and ALD, and the via contact VBC coupling the metal layers ALB and ALC. Although the second ground shield GSi surrounds the entire circumference of the second capacitor Ci in FIG. 4, the present embodiment is not limited thereto, and there may be an area in which the second ground shield GSi is not present in a portion of the entire circumference.

In FIG. 3, the distance between the second ground shield GSi and the second electrodes EDi, ECi, and EBi, which are the electrodes of the second capacitor Ci, in the first direction DR1 is defined as LA2. Further, the distance between the second ground shield GSi and the second electrodes EDi, ECi, and EBi in the second direction DR2 orthogonal to the first direction DR1 is defined as LB2.

Figure 5:
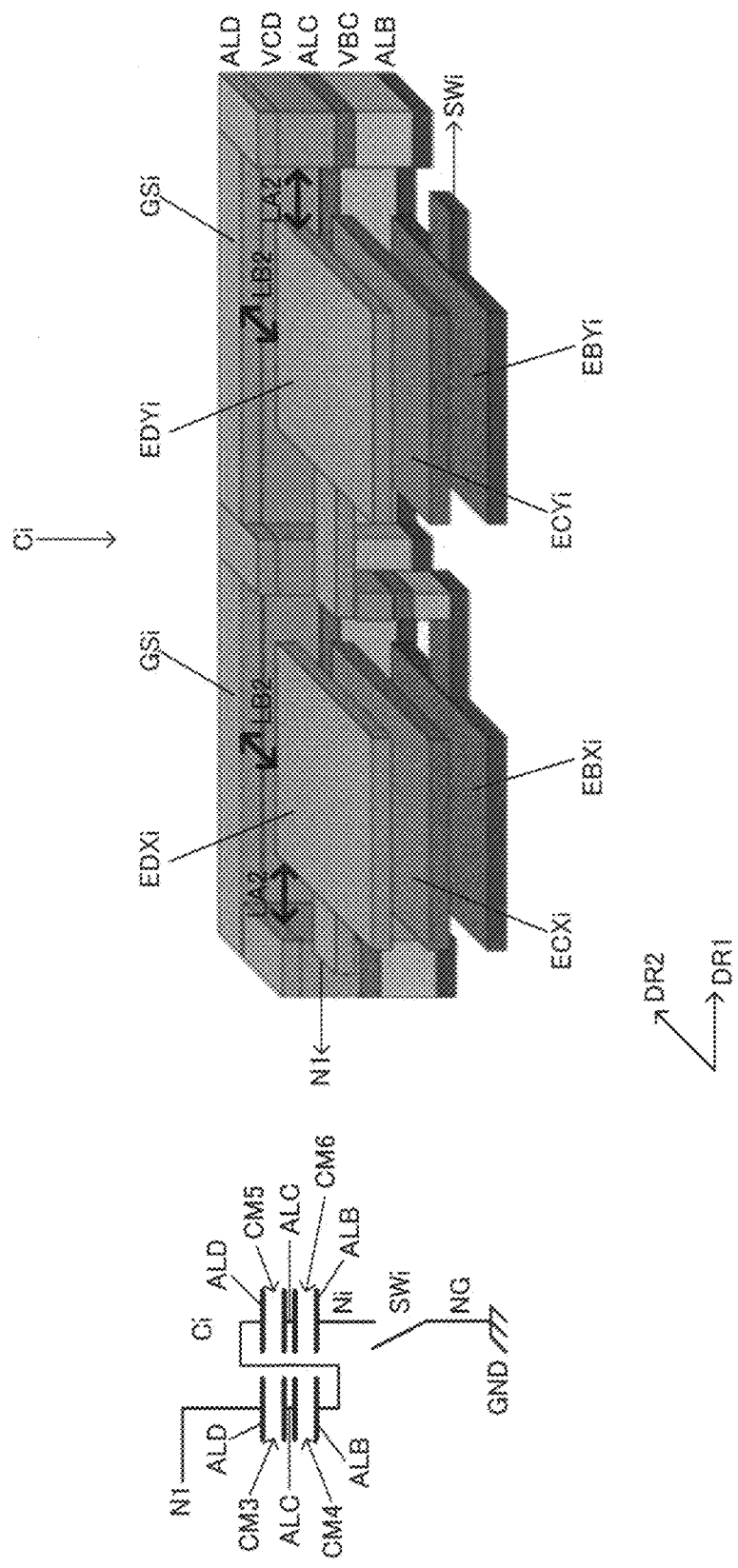
FIG. 5 is another example of a series coupling MIM capacitor.

The number of MIM capacitors coupled in series in the second capacitor Ci is not limited to 2, and may be 3 or more. For example, FIG. 5 illustrates the configuration of a second capacitor Ci in which four MIM capacitors CM3, CM4, CM5, and CM6 are coupled in series. In FIG. 5, a second electrode EDXi of the second capacitor Ci is formed by the metal layer ALD and is coupled to the first node N1. A second electrode EBXi of the second capacitor Ci is formed by the metal layer ALB and is coupled to a second electrode EDYi formed by the metal layer ALD. A second electrode EBYi of the second capacitor Ci is formed of the metal layer ALB and is coupled to the node Ni at the other end of the second switch SWi.

As illustrated in FIG. 1, in the first capacitor Cj and the second capacitor Ci, parasitic capacitances CPj and CPi are generated between the first capacitor Cj and the second capacitor Ci and the ground node NG. As will be described in detail with reference to FIGS. 12 to 14, the capacitance values of the parasitic capacitances CPj and CPi differ when the first switch SWj and the second switch SWi are on and when the first switch SWj and the second switch SWi are off. Here, the capacitance value between the first node N1 and the ground node NG due to the first capacitor Cj and the parasitic capacitance CPj of the first capacitor Cj is defined as a first capacitance value. The first capacitance value corresponds to the sum of the capacitance value of the first capacitor Cj and the capacitance value of the parasitic capacitance CPj of the first capacitor Cj. Further, the capacitance value between the first node N1 and the ground node NG due to the second capacitor Ci and the parasitic capacitance CPi of the second capacitor Ci is defined as a second capacitance value. The second capacitance value corresponds to the sum of the capacitance value of the second capacitor Ci and the capacitance value of the parasitic capacitance CPi of the second capacitor Ci.

The capacitance difference per 1 LSB of the control data DCN between the first capacitance value when the first switch SWj is turned on and the first capacitance value when the first switch SWj is turned off is a first capacitance difference. That is, the capacitance difference of 1 LSB when the first switch SWj is turned on and off for the first capacitance value between the first node N1 and the ground node NG due to the first capacitor Cj and the parasitic capacitance CPj, is defined as the first capacitance difference. Further, the capacitance difference per 1 LSB of the control data DCN between the second capacitance value when the second switch SWi is turned on and the second capacitance value when the second switch SWi is turned off is defined as a second capacitance difference. That is, the capacitance difference of 1 SB when the second switch SWi is turned on and off for the second capacitance value between the first node N1 and the ground node NG due to the second capacitor Ci and the parasitic capacitance CPi, is defined as the second capacitance difference. Details of the first capacitance difference and the second capacitance difference will be specifically described with reference to FIG. 15 described later.

At this time, in the present embodiment, a shape pattern of at least one of the first electrodes EDj, ECj, and EBj of the first capacitor Cj illustrated in FIG. 2, the first ground shield GSj surrounding the first electrodes EDj, ECj, and EBj, the second electrodes EDi, ECi, and EBi of the second capacitor Ci illustrated in FIG. 3, and the second ground shield GSi surrounding the second electrodes EDi, ECi, and EBi is set in plan view so that the first capacitance difference and the second capacitance difference become close to each other. That is, a shape pattern of at least one of the first electrode EDj, ECj, and EBj, the first ground shield GSj, the second electrode EDi, ECi, and EBi, and the second ground shield GSi is set so that the first capacitance difference and the second capacitance difference become close to each other. For example, at least one of the first disposition relationship between the first electrodes EDj, ECj, and EBj and the first ground shield GSj illustrated in FIG. 2 and the second disposition relationship between the second electrodes EDi, ECi, and EBi and the second ground shield GSi illustrated in FIG. 3, is set so that the first capacitance difference and the second capacitance difference become close to each other. The first disposition relationship is the distance relationship between the first electrodes EDj, ECj, and EBj and the first ground shield GSj, the relationship between the facing areas of the side surfaces of the first electrodes EDj, ECj, and EBj and the side surface of the first ground shield GSj facing the corresponding side surfaces, or the like. The second disposition relationship is the distance relationship between the second electrodes EDi, ECi, and EBi and the second ground shield GSi, the relationship between the facing areas of the side surfaces of the second electrodes EDi, ECi, and EBi and the side surface of the second ground shield GSi facing the corresponding side surfaces, or the like.

Specifically, for the first capacitor Cj of the parallel coupling MIM, to increase the parasitic capacitance CPj, a shape pattern of at least one of the first electrodes EDj, ECj, and EBj and the first ground shield GSj is set, or the first disposition relationship between the first electrodes EDj, ECj, and EBj and the first ground shield GSj is set. On the other hand, for the second capacitor Ci of the series coupling MIM, to reduce the parasitic capacitance CPi, a shape pattern of at least one of the second electrodes EDi, ECi, and EBi and the second ground shield GSi is set, or the second disposition relationship between the second electrodes EDi, ECi, and EBi and the second ground shield GSi is set. In the present embodiment, a capacitor in which a plurality of MIM capacitors are coupled in parallel is appropriately described as a capacitor of a parallel coupling MIM, and a capacitor in which a plurality of MIM capacitors are coupled in series is appropriately described as a capacitor of a series coupling MIM.

For example, as illustrated in FIG. 2, the distance between the first electrodes EDj, ECj, and EBj and the first ground shield GSj in the first direction DR1 is defined as LA1. Further, as illustrated in FIG. 3, the distance between the second electrodes EDi, ECi, and EBi and the second ground shield GSi in the first direction DR1 is defined as LA2. At this time, as illustrated in the cross-sectional views of the first capacitor Cj and the second capacitor Ci in FIGS. 6 and 7, the relationship of LA2>LA1 is established.

Figure 6:
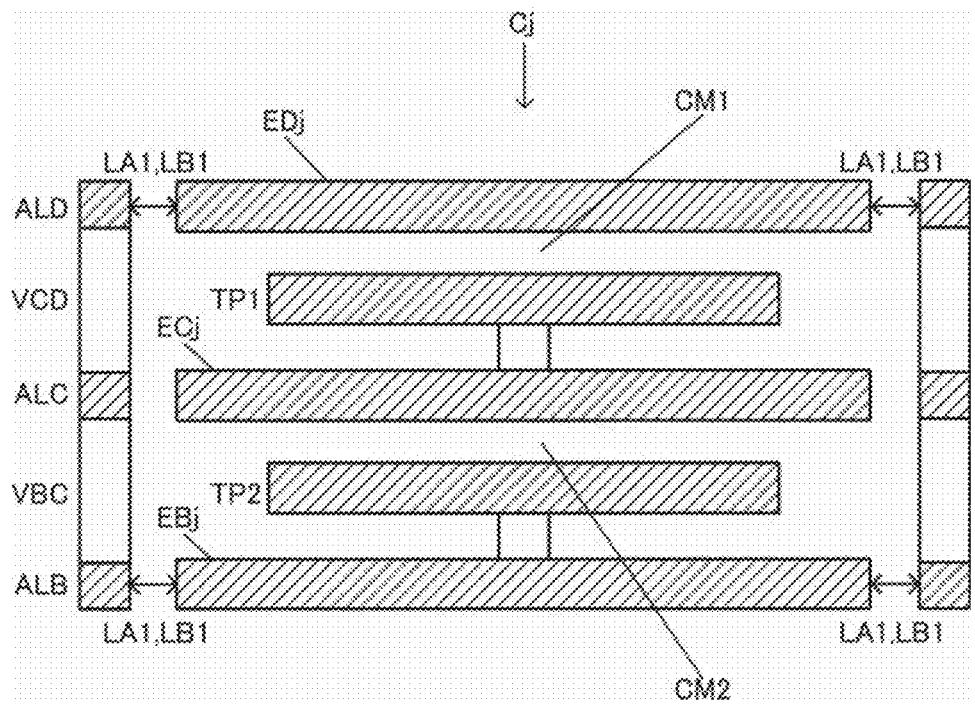
FIG. 6 is an explanatory diagram of a method for increasing the parasitic capacitance of a parallel coupling MIM capacitor.
Figure 7:
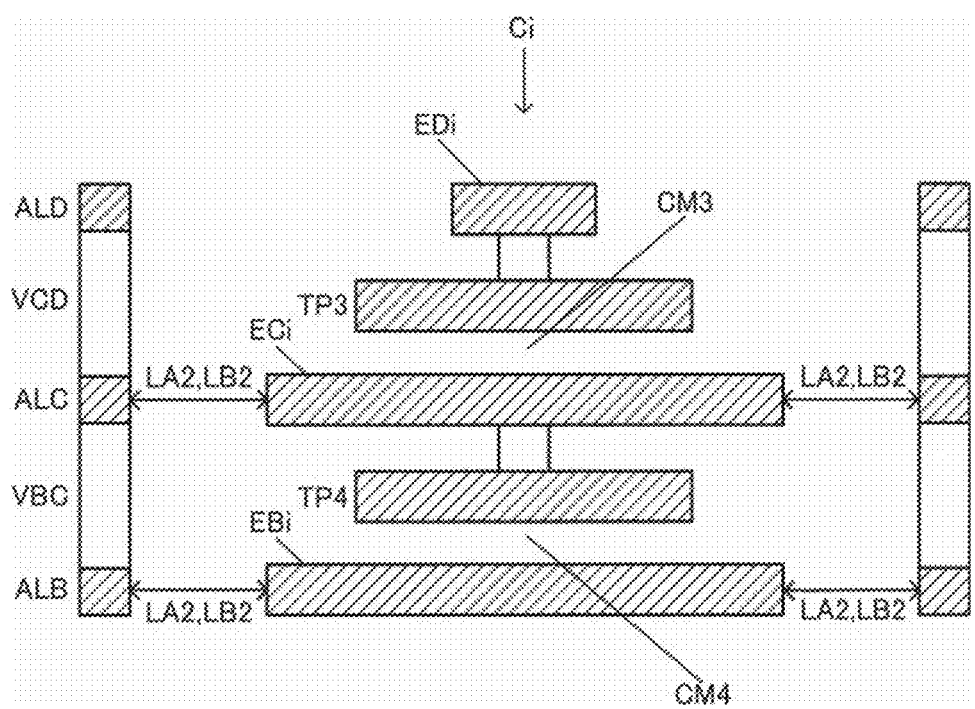
FIG. 7 is an explanatory diagram of a method for reducing the parasitic capacitance of a series coupling MIM capacitor.

That is, as illustrated in FIG. 6, for the first capacitor Cj of the parallel coupling MIM, the distance LA1 in the first direction DR1 between the first electrodes EDj, ECj, and EBj and the first ground shield GSj is reduced, so that the parasitic capacitance CPj is increased. On the other hand, as illustrated in FIG. 7, for the second capacitor Ci of the series coupling MIM, the distance LA2 in the first direction DR1 between the second electrodes EDi, ECi, and EBi and the second ground shield GSi is increased, so that the parasitic capacitance CPi is reduced. By setting LA2>LA1 in this way, the parasitic capacitance CPj of the first capacitor Cj of the parallel coupling MIM is increased, and the parasitic capacitance CPi of the second capacitor Ci of the series coupling MIM is reduced. By doing in this manner, the first capacitance difference per 1 LSB when the first switch SWj for the first capacitor Cj of the parallel coupling MIM is turned on and off and the second capacitance difference per 1 LSB when the second switch SWi for the second capacitor Ci of the series coupling MIM is turned on and off, become close to each other. Accordingly, it is possible to linearly change the capacitance value of the variable capacitance circuit 30 with respect to the change in the control data DCN.

Further, as illustrated in FIG. 2, the distance between the first electrodes EDj, ECj, and EBj and the first ground shield GSj in the second direction DR2 is defined as LB1. Further, as illustrated in FIG. 3, the distance between the second electrodes EDi, ECi, and EBi and the second ground shield GSi in the second direction DR2 is defined as LB2. At this time, the relationship of LB2>LB1 is established.

That is, as illustrated in FIG. 6, for the first capacitor Cj of the parallel coupling MIM, the distance LB1 in the second direction DR2 between the first electrodes EDj, ECj, and EBj and the first ground shield GSj is reduced, so that the parasitic capacitance CPj is increased. On the other hand, as illustrated in FIG. 7, for the second capacitor Ci of the series coupling MIM, the distance LB2 in the second direction DR2 between the second electrodes EDi, ECi, and EBi and the second ground shield GSi is increased, so that the parasitic capacitance CPi is reduced. By doing in this manner, the first capacitance difference per 1 LSB when the first switch SWj for the first capacitor Cj of the parallel coupling MIM is turned on and off and the second capacitance difference per 1 LSB when the second switch SWi for the second capacitor Ci of the series coupling MIM is turned on and off, become close to each other. Accordingly, it is possible to linearly change the capacitance value of the variable capacitance circuit 30 with respect to the change in the control data DCN.

2. Detailed Configuration Example

Figure 8:
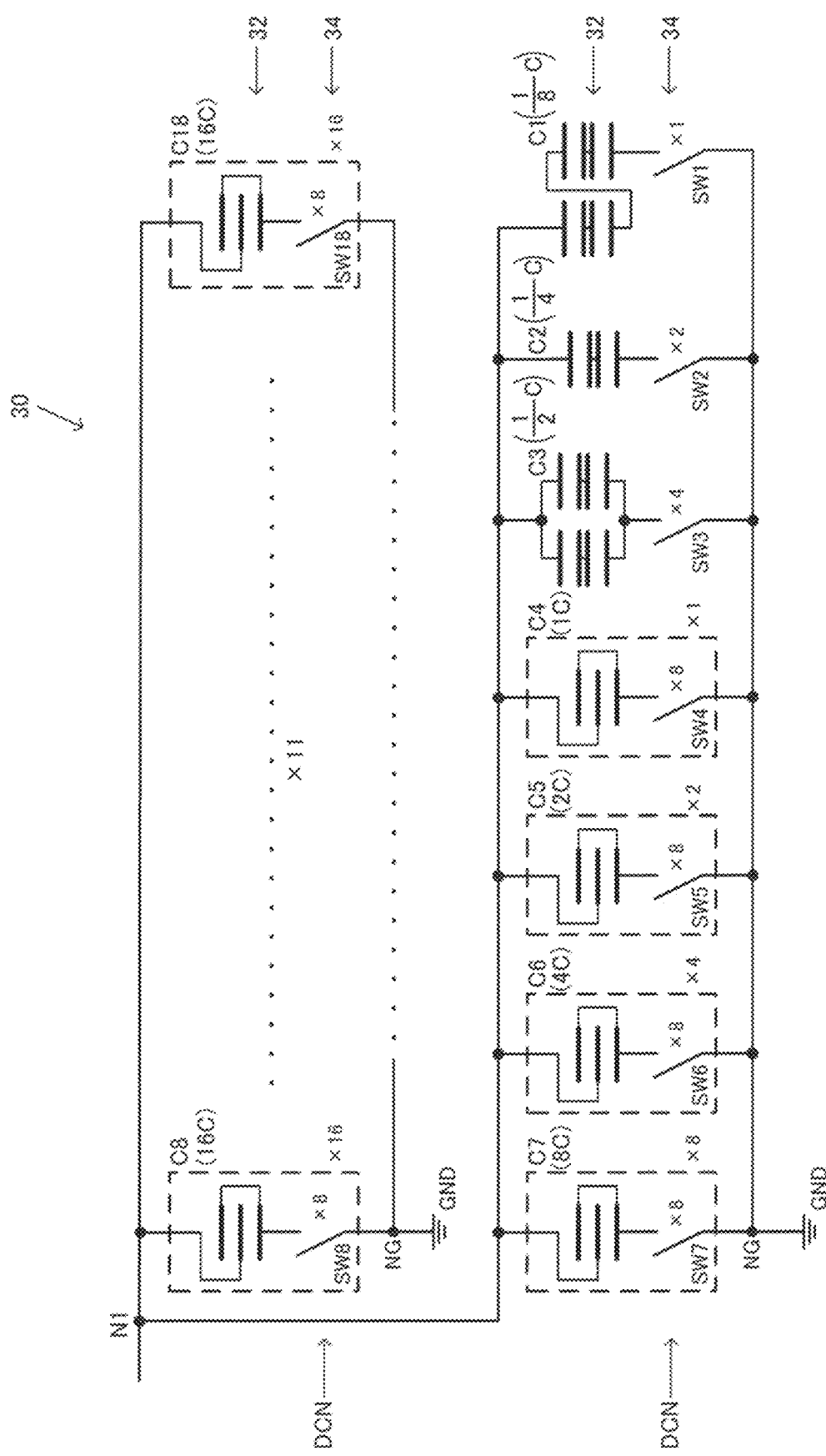
FIG. 8 is a detailed configuration example of the variable capacitance circuit of the present embodiment.

FIG. 8 illustrates a detailed configuration example of the variable capacitance circuit 30 of the present embodiment. As illustrated in FIG. 8, the variable capacitance circuit 30 whose capacitance value is variably controlled based on the control data DCN includes the capacitor array 32 and the switch array 34. The capacitor array 32 includes a plurality of capacitors C18 to C1. The switch array 34 has a plurality of switches SW18 to SW1 that are turned on or off based on the control data DCN, and is provided in series with the capacitor array 32 between the first node N1 and the ground node NG.

The capacitors C18 to C8 on the side of the upper bit have the same capacitance value, and the switches SW18 to SW8 are controlled to be turned on and off by the control data DCN of the thermometer type code. On the other hand, the capacitors C7 to C1 on the side of the lower bit have the capacitance values that are weighted in binary, and the switches SW7 to SW1 are controlled to be turned on and off by the control data DCN of the binary code.

The capacitors C18 to C4 are each the capacitor of the parallel coupling MIM in which a plurality of MIM capacitors are coupled in parallel, and correspond to the first capacitors Cj in FIGS. 1 and 2. When the capacitance value of the capacitor C4 is 1C, the capacitance values of the capacitors C7, C6, and C5 are 8C, 4C, and 2C, respectively, and are weighted in binary. Specifically, the capacitor C7 corresponds to the one in which the eight capacitors C4 are coupled in parallel, the capacitor C6 corresponds to the one in which the four capacitors C4 are coupled in parallel, and the capacitor C5 corresponds to the one in which the two capacitors C4 are coupled in parallel. Further, each of the capacitors C18 to C8 corresponds to the one in which the 16 capacitors C4 are coupled in parallel. The switch SW4 of the capacitor C4 is configured by coupling eight transistors in parallel. The same applies to the switches SW18 to SW5 of the capacitors C18 to C5.

On the other hand, the capacitors C3, C2, and C1 are each the capacitor of the series coupling MIM in which a plurality of MIM capacitors are coupled in series, and correspond to the second capacitors Ci in FIGS. 1 and 3. When the capacitance value of the capacitor C4 is 1C, the capacitance values of the capacitors C3, C2, and C1 are $(1/2) \times C$, $(1/4) \times C$, and $(1/8) \times C$, respectively, and weighted in binary. Specifically, the capacitor C3 is configured by coupling two capacitors in each of which two MIM capacitors are coupled in series in parallel. The capacitor C2 is configured by coupling two MIM capacitors in series as illustrated in FIG. 3. The capacitor C1 is configured by coupling four MIM capacitors in series as illustrated in FIG. 5. Further, the switches SW3 and SW2 are configured by coupling four or two transistors in parallel, respectively, and the switch SW1 is configured by one transistor.

Figure 9:
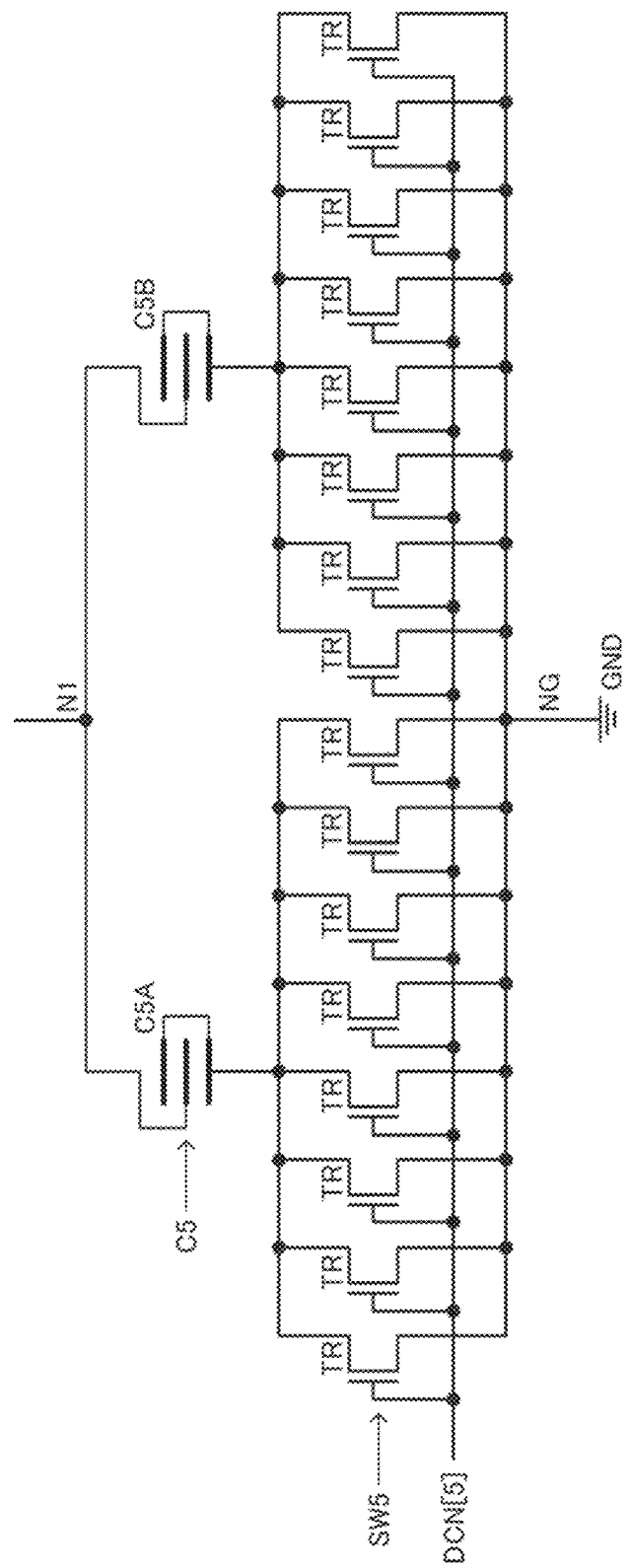
FIG. 9 is a specific configuration example of a capacitor and a switch.

For example, FIG. 9 illustrates a specific configuration example of the capacitor C5 and the switch SW5. As illustrated in FIG. 9, the capacitor C5 is configured by coupling two capacitors C5A and C5B in parallel, and each of the capacitors C5A and C5B is configured by coupling two MIM capacitors in parallel. Further, the switch SW5 is constituted with eight transistors TR coupled in parallel between the capacitor C5A and the ground node NG, and the eight transistors TR coupled in parallel between the capacitor C5B and the ground node NG. The transistor TR corresponds to the unit switch.

For example, in the capacitors C7 to C1 of FIG. 8, the capacitance value is weighted in binary. Accordingly, for example, as the switch SW1 of the capacitor C1 is constituted with one transistor, the switch SW2 of the capacitor C2 is constituted with two transistors, and the switch SW3 of the capacitor C3 is constituted with four transistors, the number of transistors constituting each switch is set to the number corresponding to the capacitance value of each corresponding capacitor. By doing in this manner, it is possible to prevent the linearity of the capacitance value change of the variable capacitance circuit 30 from being deteriorated due to the parasitic capacitance such as the drain capacitance of the transistor.

Figure 10:
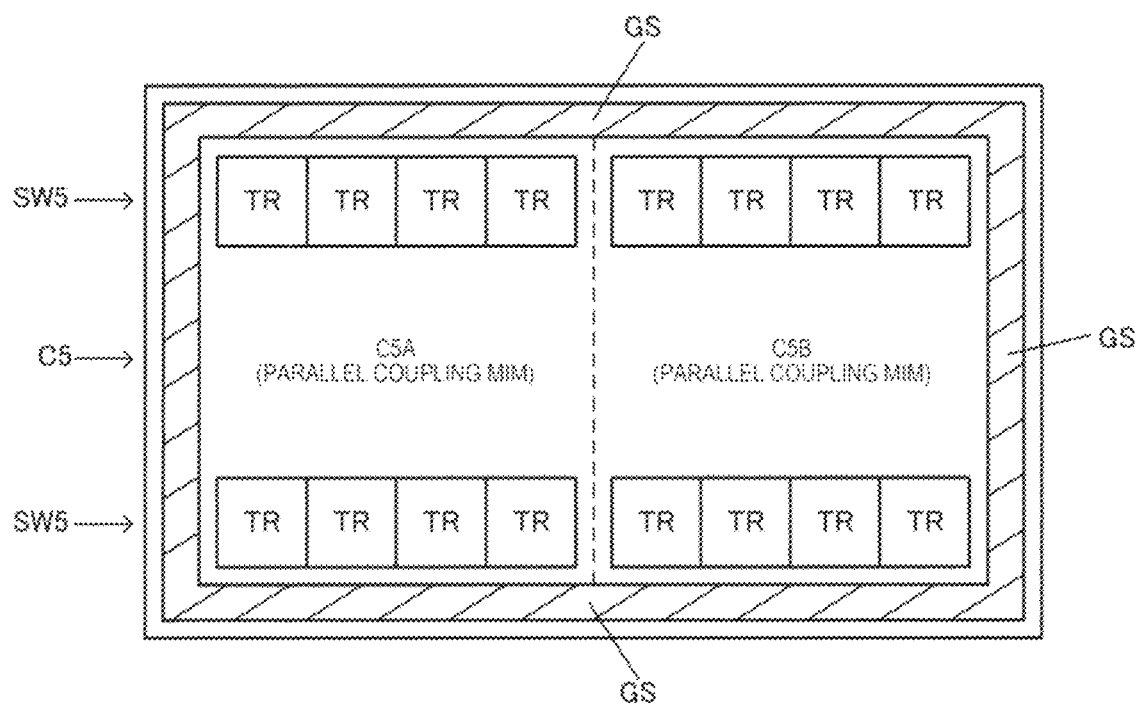
FIG. 10 is an example of layout disposition of a capacitor and a switch.

FIG. 10 illustrates an example of layout disposition of the capacitor C5 and the switch SW5 of FIG. 9. In FIG. 10, the capacitor C5A of the parallel coupling MIM is disposed on the left side of the paper surface, and the capacitor C5B of the parallel coupling MIM is also disposed on the right side. The eight transistors TR coupled to the capacitor C5A are disposed on the upper side and the lower side of the capacitor C5A. Further, the eight transistors TR coupled to the capacitor C5B are disposed on the upper side and the lower side of the capacitor C5B. A ground shield GS is provided to surround the capacitors C5A and C5B and the plurality of transistors TR constituting the switch SW5.

In the present embodiment, as illustrated in FIGS. 1 and 8, the capacitor array 32 is configured by combining the capacitors of the parallel coupling MIM and the capacitors of the series coupling MIM. These capacitors are capacitors in each of which a plurality of MIM capacitors are stacked, for example, in the vertical direction. By coupling a plurality of MIM capacitors in series, it is possible to realize a capacitor having a small capacitance value. Accordingly, for example, the resolution of the capacitance value of the variable capacitance circuit 30 can be improved by using a capacitor of the series coupling MIM that can make the capacitance value smaller as the capacitor on the side of the lower bit.

Figure 11:
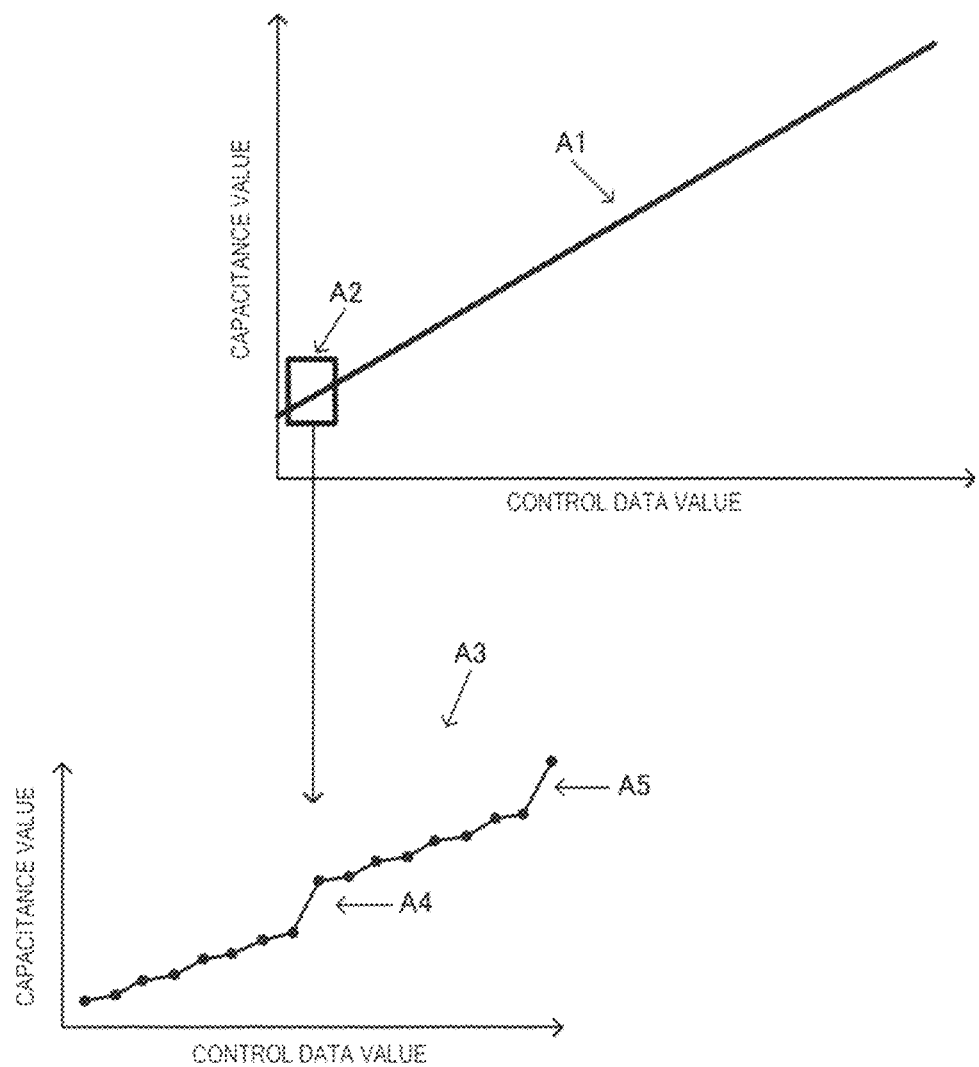
FIG. 11 is an explanatory diagram of a deterioration of linearity of capacitance value change.
Figure 12:
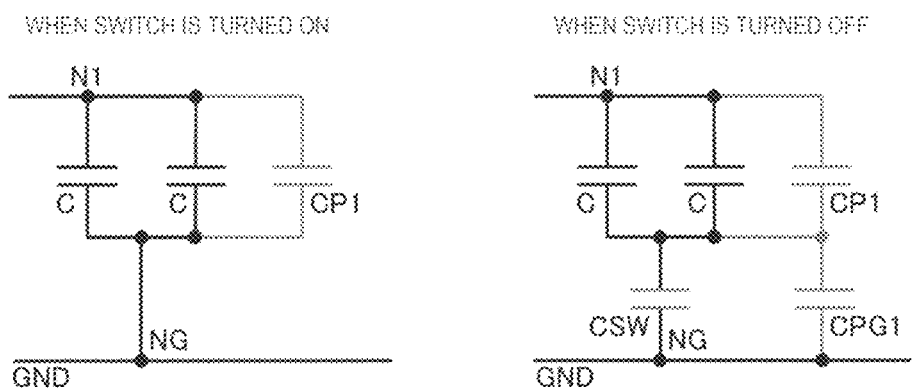
FIG. 12 is an equivalent circuit diagram of a parallel coupling MIM capacitor when a switch is turned on and when a switch is turned off.
Figure 13:
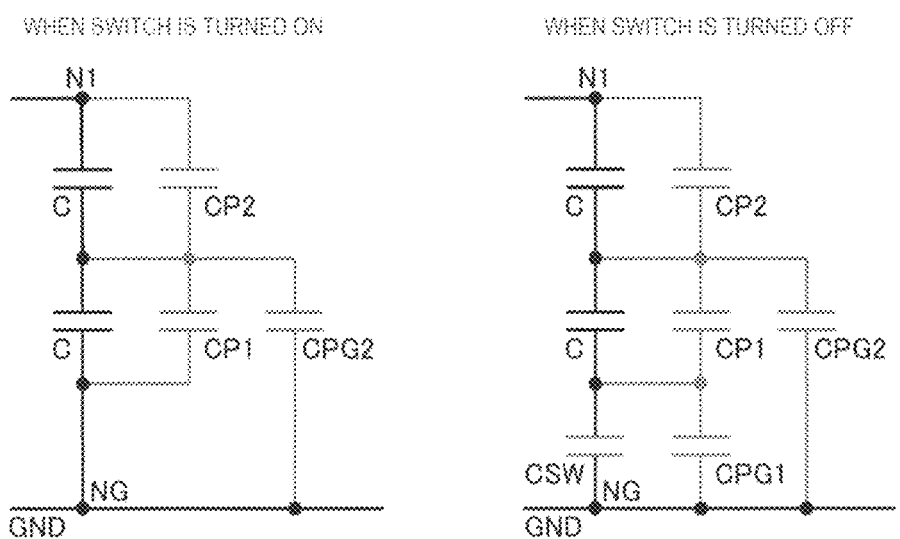
FIG. 13 is an equivalent circuit diagram of a series coupling MIM capacitor when a switch is turned on and when a switch is turned off.
Figure 14:
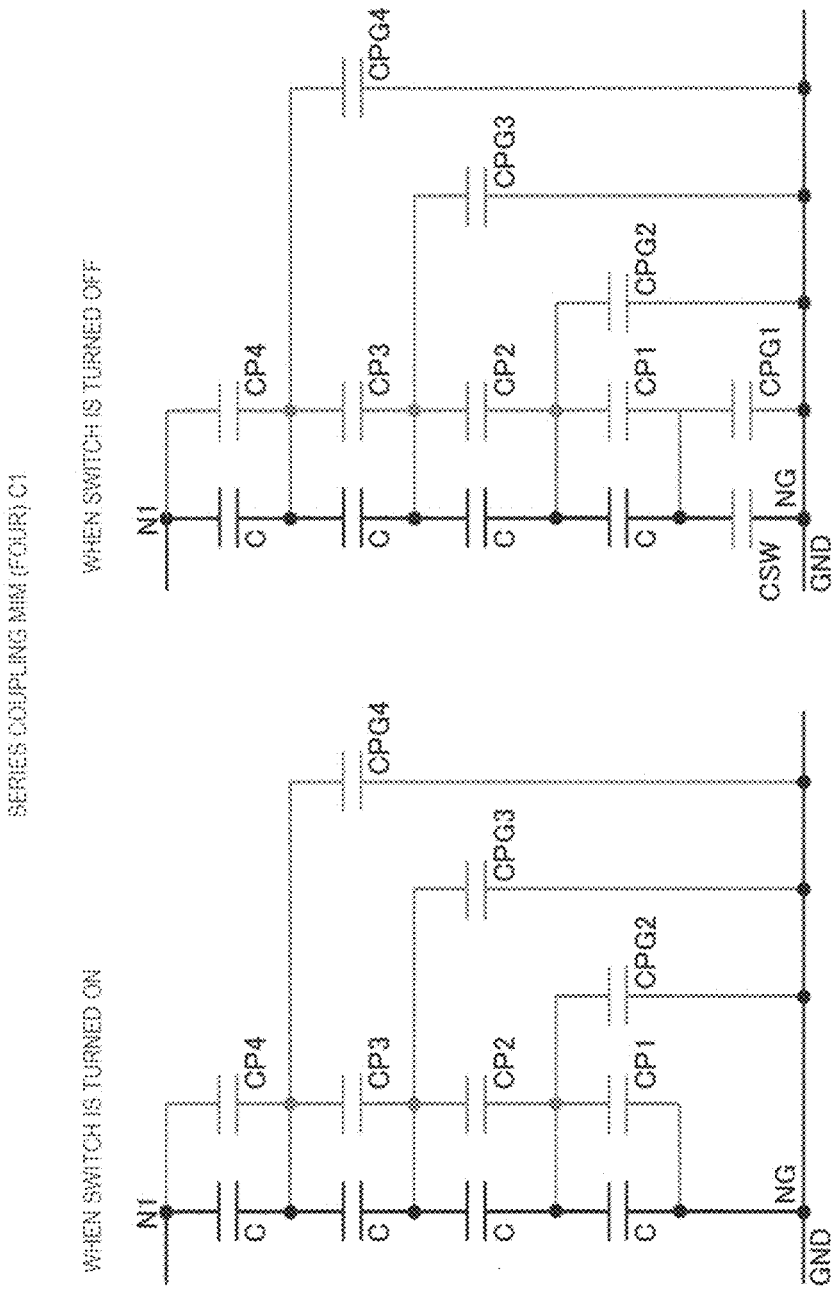
FIG. 14 is an equivalent circuit diagram of a series coupling MIM capacitor when a switch is turned on and when a switch is turned off.
Figure 23:
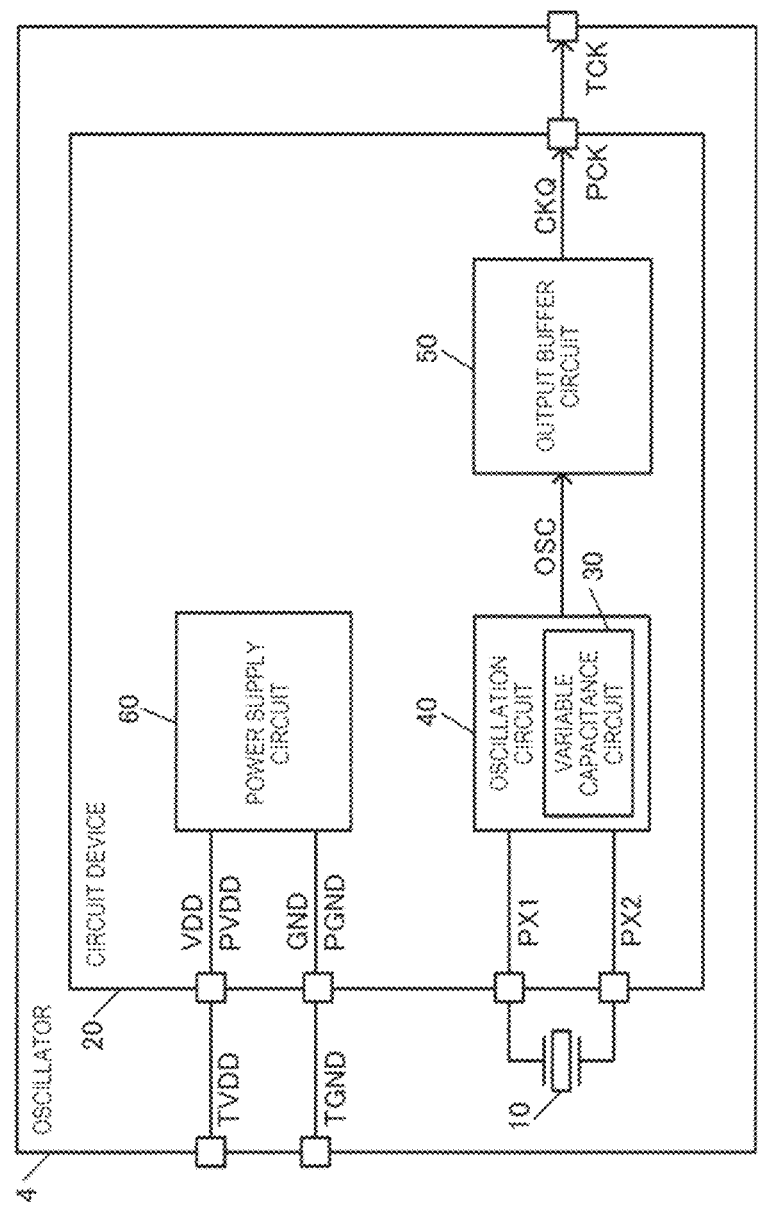
FIG. 23 is a configuration example of the circuit device of the present embodiment.

However, as will be described later with reference to FIGS. 12 to 14, the capacitor of the series coupling MIM has a larger parasitic capacitance with respect to the ground than the capacitor of the parallel coupling MIM. Accordingly, there arises a problem that the linearity of the change in the capacitance value of the variable capacitance circuit 30 with respect to the control data value, which is the value of the control data DCN, deteriorates. For example, as illustrated in A1 of FIG. 11, the variable capacitance circuit 30 is configured such that the capacitance value changes linearly with respect to the control data value. However, as illustrated in A3, which is an enlarged portion of the portion illustrated in A2 of FIG. 11, the linearity of the capacitance value with respect to the control data value is broken in the range illustrated in A4 and A5, for example. For example, the range of A4 in FIG. 11 is a range that has transitioned from the state in which the capacitor C4 is not selected and the capacitors C3, C2, and C1 are selected, to the state in which the capacitor C4 is selected and the capacitors C3, C2, and C1 are not selected. That is, it is the range in which the lower 4 bits of the control data DCN have transitioned from 0111 to 1000. The range of A5 in FIG. 11 is a range that has transitioned from the state in which the capacitor C5 is not selected and the capacitor C4, C3, C2, and C1 are selected, to the state in which the capacitor C5 is selected and the capacitors C4, C3, C2, and C1 are not selected. That is, it is the range in which the lower 5 bits of the control data DCN have transitioned from 01111 to 10000. When the linearity of the capacitance value change deteriorates in this way, for example, when the variable capacitance circuit 30 is used in the circuit device 20 of an oscillator 4 as illustrated in FIG. 23 described later, there is a problem that the accuracy of the oscillation frequency deteriorates, or the like.

It has been found that the deterioration of the linearity of the capacitance value change occurs because the parasitic capacitance with respect to the ground or the like changes between when the switch is turned on and when the switch is turned off. For example, FIG. 12 illustrates, for the capacitors C18 to C4 of the parallel coupling MIM of FIG. 8, an equivalent circuit diagram including a parasitic capacitance CP1 when the switch is turned on, and an equivalent circuit diagram including parasitic capacitances CP1, CPG1 and CSW when the switch is turned off. The CP1 is a parasitic capacitance generated between two electrodes of the capacitor, the CPG1 is a parasitic capacitance generated between the electrode of the capacitor and the ground, and the CSW is a parasitic capacitance generated in the drain of the switch or the like. Further, FIG. 13 illustrates, for the capacitors C3 and C2 of the parallel coupling MIM of FIG. 8, an equivalent circuit diagram of including the parasitic capacitances CP1, CP2, and CPG2 when the switch is turned on, and an equivalent circuit diagram including the parasitic capacitances CP1, CP2, CPG1, CPG2, and CSW when the switch is turned off. The CP1 and CP2 are parasitic capacitances generated between the two electrodes of the capacitor, and the CPG1 and CPG2 are parasitic capacitances generated between the electrodes of the capacitor and the ground. C indicates one MIM capacitor. Further, FIG. 14 illustrates, for the capacitor C1 of the parallel coupling MIM of FIG. 8, an equivalent circuit diagram including the parasitic capacitances CP1 to CP4 and CPG2 to CPG4 when the switch is turned on, and an equivalent circuit diagram including the parasitic capacitances CP1 to CP4, CPG1 to CPG4, and CSW when the switch is turned off. The CP1 to CP4 are parasitic capacitances generated between the two electrodes of the capacitor, and the CPG1 to CPG4 are parasitic capacitances generated between the electrodes of the capacitor and the ground. In this way, the capacitor of the parallel coupling MIM and the capacitor of the series coupling MIM are different in the location and the way of attaching the parasitic capacitance when the switch is turned on or when the switch is turned off.

Here, the capacitance value between the first node N1 and the ground node NG for the capacitor of the parallel coupling MIM, which is the first capacitor Cj, is defined as the first capacitance value. As illustrated in FIG. 12, the first capacitance value, which is the capacitance value between the first node N1 and the ground node NG of the capacitors C18 to C4 of the parallel coupling MIM when the switch is turned on, is a capacitance value due to the capacitors C18 to C4 in which the two MIM capacitors C are coupled in parallel and the parasitic capacitance CP1 of the capacitors C18 to C4. Further, the first capacitance value of the capacitors C18 to C4 of the parallel coupling MIM when the switch is turned off is a capacitance value by the capacitors C18 to C4, and the parasitic capacitances CP1, CPG1, and CSW of the capacitors C18 to C4.

Further, the capacitance value between the first node N1 and the ground node NG of the capacitor of the series coupling MIM which is the second capacitor Ci is defined as the second capacitance value. As illustrated in FIG. 13, the second capacitance value, which is the capacitance value between the first node N1 and the ground node NG of the capacitors C3 and C2 of the series coupling MIM when the switch is turned on, is a capacitance value due to the capacitors C3 and C2 in which the two MIM capacitors C are coupled in series and the parasitic capacitances CP1, CP2, and CPG2 of the capacitors C3 and C2. Further, the second capacitance value of the capacitors C3 and C2 of the series coupling MIM when the switch is turned off is a capacitance value by the capacitors C3 and C2 and the parasitic capacitances CP1, CP2, CPG1, CPG2, and CSW of the capacitors C3 and C2. Further, as illustrated in FIG. 14, the second capacitance value between the first node N1 and the ground node NG of the capacitor C1 of the series coupling MIM when the switch is turned on is the capacitance value due to the capacitor C1 in which four MIM capacitors C are coupled in series and the parasitic capacitances CP1 to CP4 and CPG2 to CPG4 of the capacitor C1. Further, the second capacitance value of the capacitor C1 of the series coupling MIM when the switch is turned off is a capacitance value by the capacitor C1 and the parasitic capacitances CP1 to CP4, CPG1 to CPG4, and CSW of the capacitor C1.

FIG. 15 is an example of the capacitance values of the capacitors C18 to C4 of the parallel coupling MIM, which are the first capacitor Cj, and the capacitors C3 to C1 of the series coupling MIM, which are the second capacitors Ci. In the first line of FIG. 15, the first capacitance value between the first node N1 and the ground node NG of the capacitors C18 to C4 of the parallel coupling MIM when the switch is turned on, and the second capacitance value between the first node N1 and the ground node NG of the capacitors C3 and C1 of the series coupling MIM when the switch is turned on, are illustrated. Here, the switch-on and the switch-off in the capacitors C18 to C4 of the parallel coupling MIM means that the switches SW18 to SW4, which are the first switch SWj, are turned on and off. Further, the switch-on and the switch-off in the capacitors C3 to C1 of the series coupling MIM means that the switches SW3 to SW1, which are the second switch SWi, are turned on and off.

Further, in the second line of FIG. 15, the first capacitance value between the first node N1 and the ground node NG of the capacitors C18 to C4 of the parallel coupling MIM when the switch is turned off, and the second capacitance value between the first node N1 and the ground node NG of the capacitors C3 to C1 of the series coupling MIM when the switch is turned off, are illustrated.

In the third line of FIG. 15, the first capacitance difference per 1 LSB of the control data DCN between the first capacitance value when the switch is turned on and the first capacitance value when the switch is turned off for the capacitors C18 to C4 of the parallel coupling MIM is illustrated.

Taking the capacitor C4 as an example, the first capacitance value at the time of switch-on at which the switch SW4 is turned on is 117.62 fF, and the first capacitance value at the time of switch-off is 16.08 fF. The capacitance value of the capacitor C4 is C, which is 8 times the capacitance value (1/8)×C of the capacitor C1 corresponding to LSB. Accordingly, the first capacitance difference per 1 LSB between the first capacitance value when the switch is turned on and the first capacitance value when the switch is turned off for the capacitor C4 is (117.62-16.08)/8=12.69 fF. Taking the capacitor C5 as an example, the first capacitance value at the time of switch-on at which the switch SW5 is turned on is 234.42 fF, and the first capacitance value at the time of switch-off is 30.58 fF. The capacitance value of the capacitor C5 is 2C, which is 16 times the capacitance value (1/8)×C of the capacitor C1 corresponding to LSB. Accordingly, the first capacitance difference per 1 LSB between the first capacitance value when the switch is turned on and the first capacitance value when the switch is turned off for the capacitor C5 is (234.42-30.58)/16=12.74 fF. Similarly, the first capacitance difference per 1 LSB of the capacitors C6, C7, and C18 to C8 is calculated as 12.77 fF, 12.76 fF, and 12.76 fF.

Further, in the third line of FIG. 15, the second capacitance difference per 1 LSB of the control data DCN between the second capacitance value when the switch is turned on and the second capacitance value when the switch is turned off for the capacitors C3 to C1 of the series coupling MIM is illustrated. Taking the capacitor C3 as an example, the second capacitance value at the time of switch-on at which the switch SW3 is turned on is 52.50 fF, and the second capacitance value at the time of switch-off is 16.93 fF. The capacitance value of the capacitor C3 is (1/2)×C, which is 4 times the capacitance value of the capacitor C1. Accordingly, the second capacitance difference per 1 LSB between the second capacitance value when the switch is turned on and the second capacitance value when the switch is turned off for the capacitor C3 is (52.50-16.93)/4=8.89 fF. Taking the capacitor C2 as an example, the second capacitance value at the time of switch-on at which the switch SW2 is turned on is 26.28 fF, and the second capacitance value at the time of switch-off is 9.33 fF. The capacitance value of the capacitor C2 is (1/4)×C, which is 2 times the capacitance value of the capacitor C1. Accordingly, the second capacitance difference per 1 LSB between the second capacitance value when the switch is turned on and the second capacitance value when the switch is turned off for the capacitor C2 is (26.28-9.33)/2=8.48 fF. Further, the second capacitance difference per 1 LSB between the second capacitance value when the switch is turned on and the second capacitance value when the switch is turned off for the capacitor C1 is 16.02-11.40=4.62 fF.

In this way, the first capacitance difference of the capacitors C18 to C4 of the parallel coupling MIM between when the switch is turned on and when the switch is turned off, and the second capacitance difference of the capacitors C3 to C1 of the series coupling MIM between when the switch is turned on and when the switch is turned off are significantly different, which causes the linearity of the capacitance value change to deteriorate as illustrated in A4 and A5 of FIG. 11. For example, when a state in which the switch SW4 of the capacitor C4 is turned off and the switches SW3 to SW1 of the capacitors C3 to C1 are on has transitioned to a state in which the switch SW4 is turned on and the switches SW3 to SW1 are off, the deterioration of the linearity of the capacitance value change occurs corresponding to the difference between the first capacitance difference and the second capacitance difference. For example, the larger the difference value between the first capacitance difference and the second capacitance difference, the greater the degree of the deterioration of linearity. In this way, there is a significant difference between the first capacitance difference and the second capacitance difference, as illustrated in FIGS. 12 to 14, because more parasitic capacitance is generated in the capacitor of the series coupling MIM since the location and attachment of the parasitic capacitance are different between the capacitor of the parallel coupling MIM and the capacitor of the series coupling MIM.

Accordingly, in the present embodiment, a method is adopted in which the first capacitance difference of the capacitor of the parallel coupling MIM illustrated in FIG. 15 and the second capacitance difference of the capacitor of the series coupling MIM are brought close to each other. For example, by reducing the first capacitance difference or increasing the second capacitance difference, the first capacitance difference and the second capacitance difference become close to each other, and the linearity of the capacitance value change can be improved. Specifically, for the capacitor of the parallel coupling MIM, the value of parasitic capacitance with respect to ground is increased. Accordingly, for example, the capacitance value when the switch is turned off is large, so that the first capacitance difference becomes small and the first capacitance difference and the second capacitance difference become close to each other, and thus the linearity of the capacitance value change can be improved. Further, for the capacitor of the series coupling MIM, the value of parasitic capacitance with respect to ground is reduced. Accordingly, for example, the capacitance value when the switch is turned off becomes small, so that the second capacitance difference becomes large and the first capacitance difference and the second capacitance difference become close to each other, and thus the linearity of the capacitance value change can be improved.

In the present embodiment in this way, the capacitance value between the first node Ni and the ground node NG due to the capacitor of the parallel coupling MIM that is the first capacitor and the parasitic capacitance of the capacitor of the parallel coupling MIM, is defined as the first capacitance value. Further, the capacitance value between the first node N1 and the ground node NG due to the capacitor of the series coupling MIM that is the second capacitor and the parasitic capacitance of the capacitor of the series coupling MIM, is defined as the second capacitance value. The capacitance difference per 1 LSB of the control data DCN between the first capacitance value when the first switch, which is the switch of the capacitor of the parallel coupling MIM, is turned on and the first capacitance value when the first switch is turned off, is defined as the first capacitance difference. Further, the capacitance difference per 1 LSB of the control data DCN between the second capacitance value when the second switch, which is the switch of the capacitor of the series coupling MIM, is turned on and the second capacitance value when the second switch is turned off, is defined as the second capacitance difference. At this time, in the present embodiment, a method is adopted in which the first capacitance difference and the second capacitance difference are brought close to each other.

Specifically, in the present embodiment, the method described with reference to FIGS. 2 to 7 is adopted as a method for bringing the first capacitance difference of the capacitor of the parallel coupling MIM and the second capacitance difference of the capacitor of the series coupling MIM close to each other. For example, in plan view, a shape pattern of at least one of the first electrodes EDj, ECj, and EBj of the first capacitor Cj of the parallel coupling MIM, the first ground shield GSj surrounding the first capacitor Cj, the second electrodes EDi, ECi, and EBi of the second capacitor Ci of the series coupling MIM, and the second ground shield GSi surrounding the second capacitor Ci, is set. In FIGS. 8 and 15, the capacitors C18 to C4 are the first capacitor Cj of the parallel coupling MIM. Further, the capacitors C3 to C1 are the second capacitor Ci of the series coupling MIM.

By doing in this manner, the shape pattern of the first electrode EDj, ECj, and EBj, the first ground shield GSj, the second electrode EDi, ECi, and EBi or the second ground shield GSi is set to a predetermined shape pattern, so that it is possible to bring the first capacitance difference and the second capacitance difference close to each other. For example, by setting the electrode and the ground shield in a shape pattern that increases the value of the parasitic capacitance of the first capacitor Cj or reduces the value of the parasitic capacitance of the second capacitor Ci, it is possible to bring the first capacitance difference and the second capacitance difference close to each other. When the first capacitance difference and the second capacitance difference are close to each other, it is possible to realize the variable capacitance circuit 30 that can suppress the deterioration of the linearity as illustrated in A4 and A5 of FIG. 11 and improve the linearity of the capacitance value change.

More specifically, in the present embodiment, at least one of the first disposition relationship between the first electrodes EDj, ECj, and EBj and the first ground shield GSj and the second disposition relationship between the second electrodes EDi, ECi, and EBi and the second ground shield GSi, is set so that the first capacitance difference and the second capacitance difference become close to each other. For example, as the first disposition relationship, the distance relationship, the relationship between the facing areas on the side surfaces, or the like between the first electrodes EDj, ECj, and EBj and the first ground shield GSj, are set. Further, as the second disposition relationship, the distance relationship, the relationship between the facing areas on the side surfaces, or the like between the second electrodes EDi, ECi, and EBi and the second ground shield GSi, are set. By doing in this manner, the first disposition relationship between the first electrodes EDj, ECj, and EBj and the first ground shield GSj and the second disposition relationship between the second electrodes EDi, ECi, and EBi and the second ground shield GSi are set to a predetermined disposition relationship, so that it is possible to bring the first capacitance difference and the second capacitance difference close to each other. For example, by setting the first disposition relationship and the second disposition relationship to a disposition relationship such that the value of the parasitic capacitance of the first capacitor Cj is increased or the value of the parasitic capacitance of the second capacitor Ci is reduced, it is possible to bring the first capacitance difference and the second capacitance difference close to each other. When the first capacitance difference and the second capacitance difference are close to each other, it is possible to realize the variable capacitance circuit 30 that can suppress the deterioration of the linearity as illustrated in A4 and A5 of FIG. 11 and improve the linearity of the capacitance value change.

Next, a specific method for bringing the first capacitance difference closer to the second capacitance difference will be described with reference to FIGS. 16 to 21. First, a method of bringing the first capacitance difference closer to the second capacitance difference by increasing the parasitic capacitance of the first capacitor Cj of the parallel coupling MIM will be described with reference to FIGS. 16 to 18.

Figure 16:
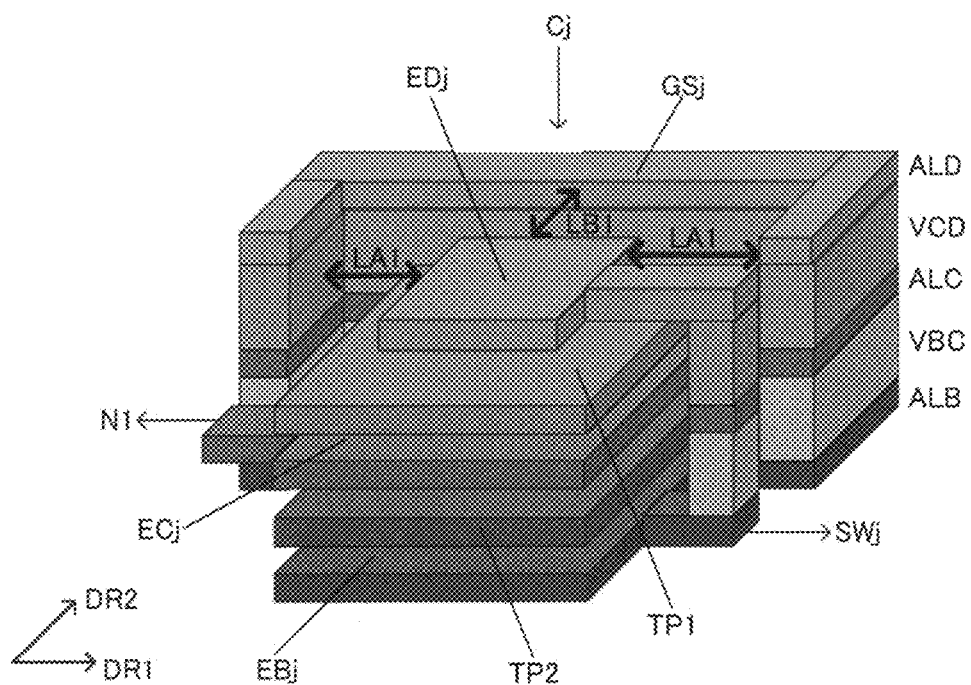
FIG. 16 is an explanatory diagram of a method for increasing the parasitic capacitance of a parallel coupling MIM capacitor.

For example, FIG. 16 illustrates an example of a shape pattern and a disposition relationship of the first capacitor Cj when the method of the present embodiment is not adopted. In FIG. 16, the distance LA1 in the first direction DR1 and the distance LB1 in the second direction DR2 between the first electrode EDj and the first ground shield GSj are long.

Figure 17:
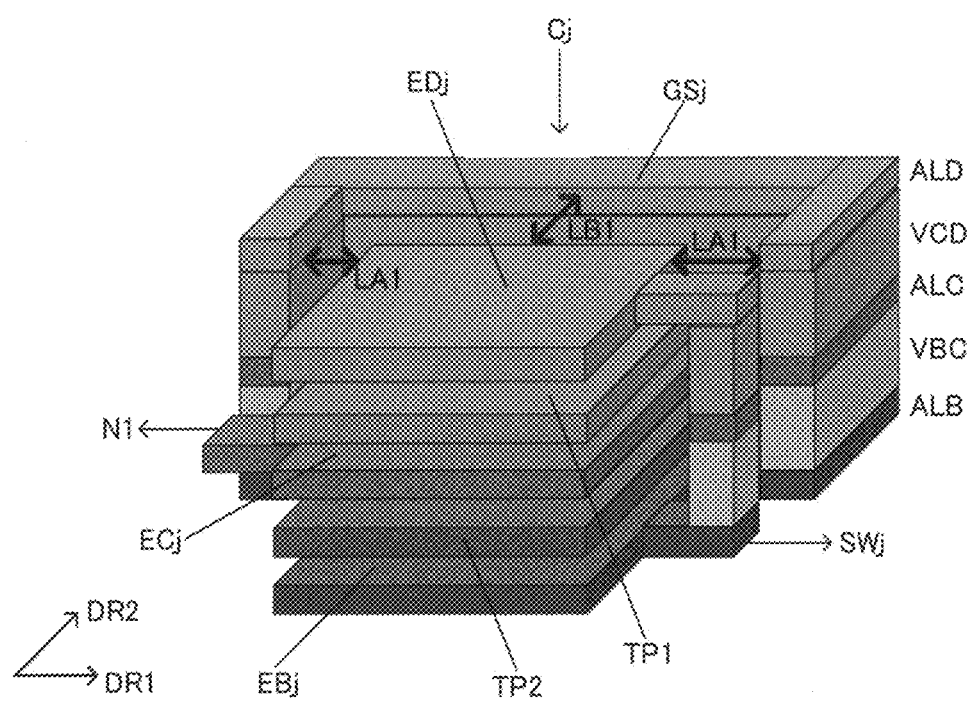
FIG. 17 is an explanatory diagram of a method for increasing the parasitic capacitance of a parallel coupling MIM capacitor.

On the other hand, FIG. 17 is an example of the shape pattern and the disposition relationship of the first capacitor Cj when the method of the present embodiment is adopted. In FIG. 17, the distance LA1 in the first direction DR1 and the distance LB1 in the second direction DR2 between the first electrode EDj and the first ground shield GSj are shorter than those in FIG. 16. By shortening the distances LA1 and LB1 in this way, the value of the parasitic capacitance with respect to the ground increases. For example, the value of the parasitic capacitance CPG1 in FIG. 12 increases. As the value of the parasitic capacitance increases, in FIG. 15, the first capacitance value of the first capacitor Cj of the parallel coupling MIM when the switch is turned off increases, so that the first capacitance difference, which is the capacitance difference between the first capacitance value when the switch is turned on and the first capacitance value when the switch is turned off, is reduced. Since the first capacitance difference of the first capacitor Cj of the parallel coupling MIM is larger than the second capacitance difference of the second capacitor Ci of the series coupling MIM, the first capacitance difference in this way is reduced, so that the first capacitance difference and the second capacitance difference become close to each other.

Accordingly, the deterioration of the linearity as illustrated in A4 and A5 of FIG. 11 can be suppressed, and the linearity of the capacitance value change of the variable capacitance circuit 30 can be improved.

Figure 18:
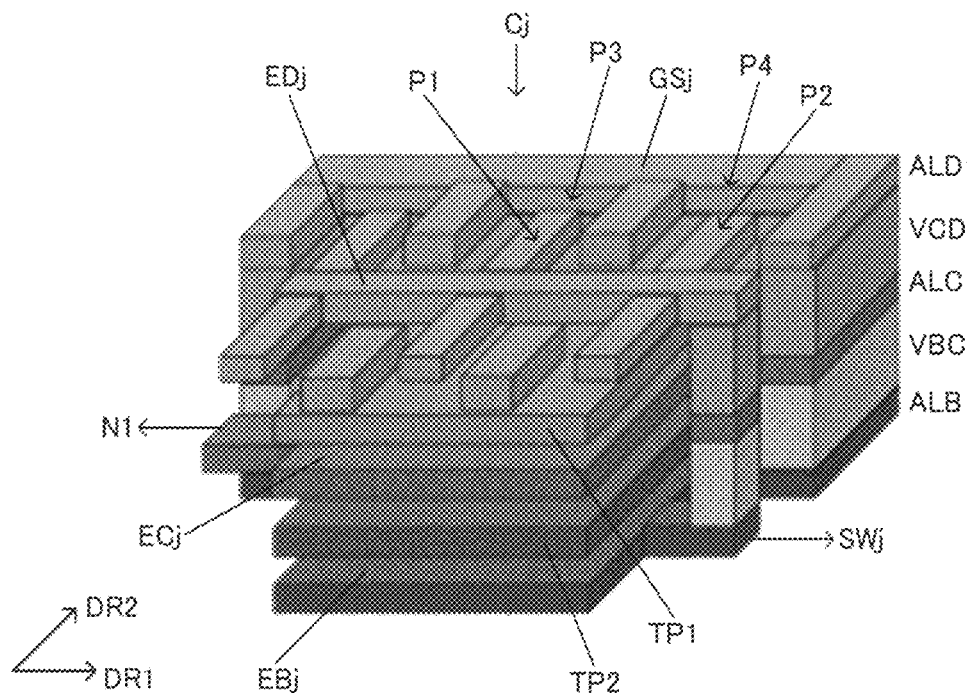
FIG. 18 is an explanatory diagram of a method for increasing the parasitic capacitance of a parallel coupling MIM capacitor.

Further, in FIG. 18, the first electrode EDj and the first ground shield GSj have a comb-tooth shape in which the side surfaces correspond to each other in plan view, so that the facing area of the adjacent side surfaces is increased. Specifically, the first electrode EDj has a first portion P1 having a convex shape in plan view and a second portion P2 having a convex shape in plan view. Further, the first ground shield GSj has a third portion P3 having a side surface facing the side surface of the first portion P1 of the first electrode EDj and having a concave shape in plan view, and a fourth portion P4 having a side surface facing the side surface of the second portion P2 of the first electrode EDj and having a concave shape in plan view. For example, the first portion P1 of a convex shape of the first electrode EDj faces the third portion P3 of a concave shape of the first ground shield GSj, for example, in the side surfaces in three directions. That is, the third portion P3 of a concave shape is formed to surround the first portion P1 of a convex shape in three directions. Further, the second portion P2 of a convex shape of the first electrode EDj faces the fourth portion P4 of a concave shape of the first ground shield GSj, for example, in the side surfaces in three directions. That is, the fourth portion P4 of a concave shape is formed to surround the second portion P2 of a convex shape in three directions. By doing in this manner, it is possible to increase the facing area of the side surfaces of the first ground shield GSj facing the side surfaces of the first electrode EDj. By increasing the facing area of the side surfaces of the first electrode EDj and the first ground shield GSj in this way, the value of the parasitic capacitance with respect to the ground increases. For example, the value of the parasitic capacitance CPG1 in FIG. 12 increases. As the value of the parasitic capacitance increases, the first capacitance value of the first capacitor Cj of the parallel coupling MIM when the switch is turned off increases, so that the first capacitance difference, which is the capacitance difference between the first capacitance value when the switch is turned on and the first capacitance value when the switch is turned off, is reduced. Since the first capacitance difference of the first capacitor Cj of the parallel coupling MIM is larger than the second capacitance difference of the second capacitor Ci of the series coupling MIM, the first capacitance difference is reduced in this way, so that the first capacitance difference and the second capacitance difference become close to each other, and the linearity of the capacitance value change of the variable capacitance circuit 30 can be improved.

Next, a method of bringing the first capacitance difference closer to the second capacitance difference by reducing the parasitic capacitance of the second capacitor Ci of the series coupling MIM will be described with reference to FIGS. 19 to 21.

Figure 19:
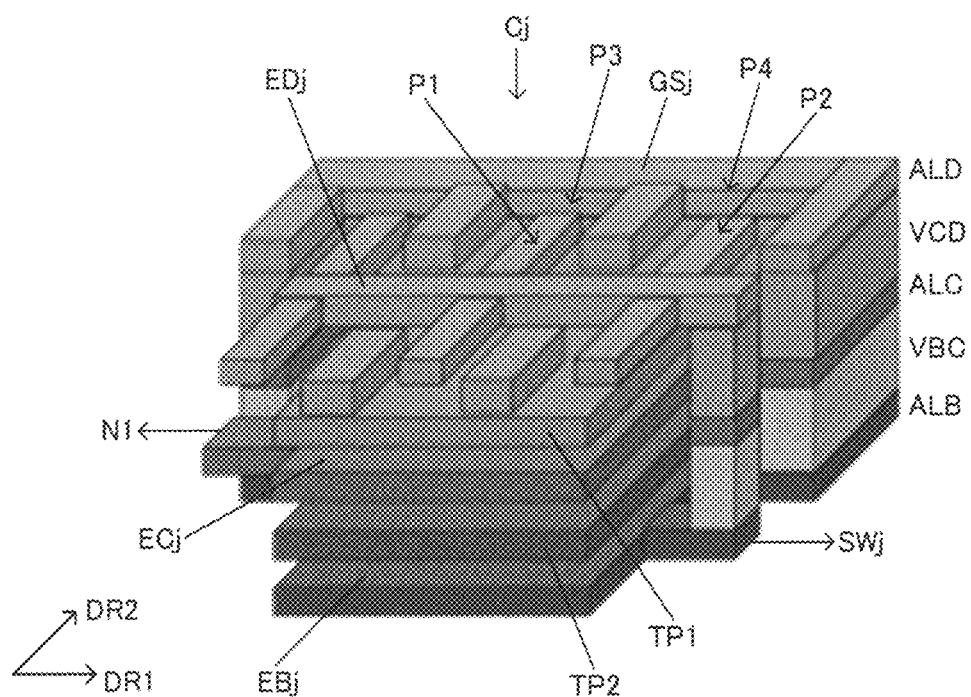
FIG. 19 is an explanatory diagram of a method for increasing the parasitic capacitance of a series coupling MIM capacitor.

For example, FIG. 19 illustrates an example of a shape pattern and a disposition relationship of the second capacitor Ci when the method of the present embodiment is not adopted. In FIG. 19, the distance LA2 in the first direction DR1 and the distance LB2 in the second direction DR2 between the second electrodes EBi, ECi, and EDi and the second ground shield GSi are shortened.

Figure 20:
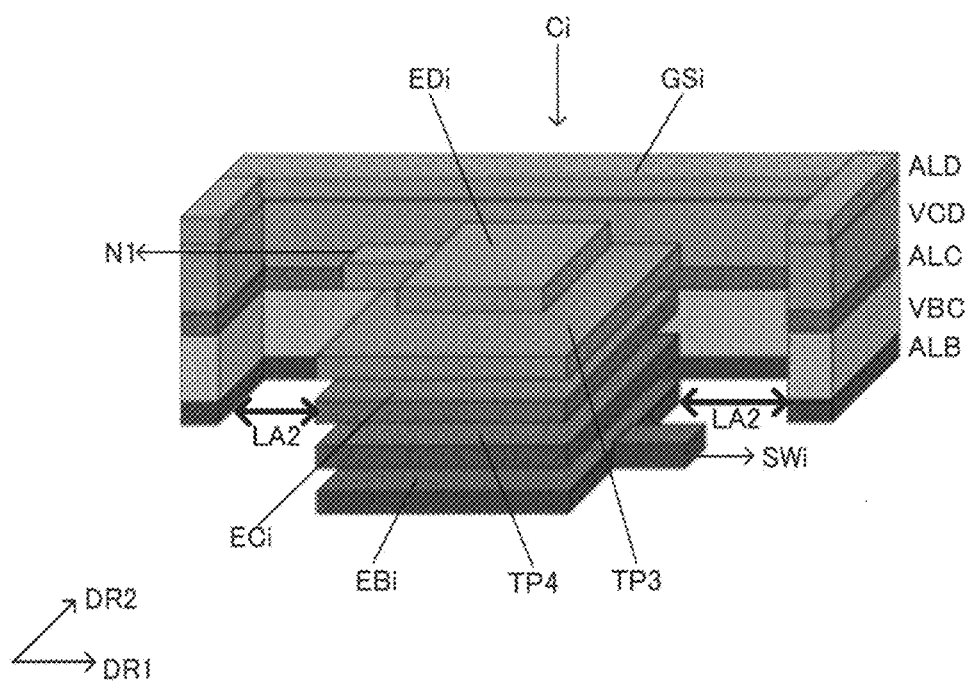
FIG. 20 is an explanatory diagram of a method for increasing the parasitic capacitance of a series coupling MIM capacitor.
Figure 21:
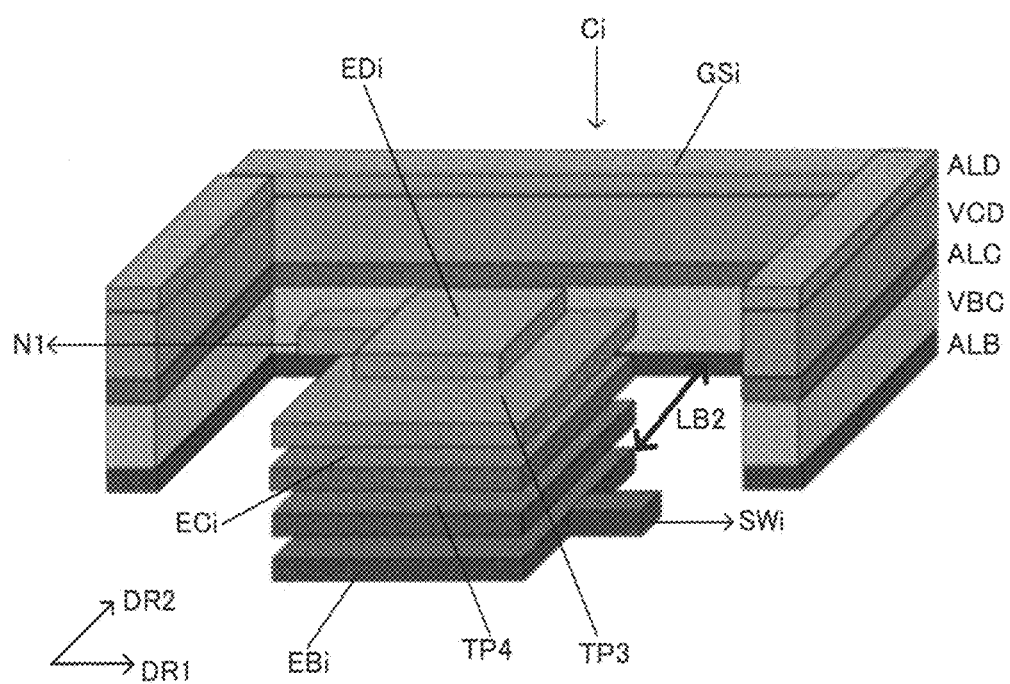
FIG. 21 is an explanatory diagram of a method for increasing the parasitic capacitance of a series coupling MIM capacitor.

On the other hand, FIGS. 20 and 21 are examples of the shape patterns and the disposition relationships of the second capacitor Ci when the method of the present embodiment is adopted. In FIG. 20, the distance LA2 between the second electrodes EBi, ECi, and EDi and the second ground shield GSi in the first direction DR1 is longer than that in FIG. 19. In FIG. 21, the distance LB2 in the second direction DR2 between the second electrodes EBi, ECi, and EDi and the second ground shield GSi is longer than that in FIG. 19. As the distances LA2 and LB2 become longer in this way, the value of the parasitic capacitance with respect to the ground is reduced. For example, the values of the parasitic capacitances CPG1 and CPG2 in FIG. 13 are reduced. As the value of the parasitic capacitance is reduced, in FIG. 15, the second capacitance value of the second capacitor Ci of the series coupling MIM when the switch is turned off is reduced, so that the second capacitance difference, which is the capacitance difference between the second capacitance value when the switch is turned on and the second capacitance value when the switch is turned off, increases. Since the second capacitance difference of the second capacitor Ci of the series coupling MIM is smaller than the first capacitance difference of the first capacitor Cj of the parallel coupling MIM, the second capacitance difference in this way increases, so that the first capacitance difference and the second capacitance difference become close to each other. Accordingly, the deterioration of the linearity as illustrated in A4 and A5 of FIG. 11 can be suppressed, and the linearity of the capacitance value change of the variable capacitance circuit 30 can be improved.

In the present embodiment in this way, in the first capacitor Cj of the parallel coupling MIM, as illustrated in FIG. 17, the distance LA1 in the first direction DR1 between the first electrode EDj or the like and the first ground shield GSj is shortened. On the other hand, in the second capacitor Ci of the series coupling MIM, as illustrated in FIG. 20, the distance LA2 in the first direction DR1 between the second electrodes EBi, ECi, and EDi and the second ground shield GSi is lengthened. That is, the relationship of LA2>LA1 is established for the distances LA1 and LA2. When the relationship of LA2>LA1 is established in this way, the distance LA1 becomes shorter in the first capacitor Cj of the parallel coupling MIM as illustrated in FIG. 17, so that the value of the parasitic capacitance with respect to the ground increases, and the first capacitance value of the first capacitor Cj of the parallel coupling MIM when the switch is turned off increases. Accordingly, the first capacitance difference, which is the capacitance difference between the first capacitance value when the switch is turned on and the first capacitance value when the switch is turned off, is reduced, and the first capacitance difference of the first capacitor Cj of the parallel coupling MIM and the second capacitance difference of the second capacitor Ci of the series coupling MIM become close to each other, so that the linearity of the capacitance value change of the variable capacitance circuit 30 can be improved. Further, when the relationship of LA2>LA1 is established, the distance LA2 becomes longer in the second capacitor Ci of the series coupling MIM as illustrated in FIG. 20, so that the value of the parasitic capacitance with respect to the ground is reduced, and the second capacitance value of the second capacitor Ci of the series coupling MIM when the switch is turned off is reduced. Accordingly, the second capacitance difference, which is the capacitance difference between the second capacitance value when the switch is turned on and the second capacitance value when the switch is turned off, is increased, and the first capacitance difference of the first capacitor Cj of the parallel coupling MIM and the second capacitance difference of the second capacitor Ci of the series coupling MIM become close to each other, so that the linearity of the capacitance value change of the variable capacitance circuit 30 can be improved.

Further, in the present embodiment, in the first capacitor Cj of the parallel coupling MIM, as illustrated in FIG. 17, the distance LB1 in the second direction DR2 between the first electrode EDj or the like and the first ground shield GSj is shortened. On the other hand, in the second capacitor Ci of the series coupling MIM, as illustrated in FIG. 21, the distance LB2 in the second direction DR2 between the second electrodes EBi, ECi, and EDi and the second ground shield GSi is lengthened. That is, the relationship of LB2>LB1 is established for the distances LB1 and LB2. When the relationship of LB2>LB1 is established in this way, the distance LB1 becomes shorter in the first capacitor Cj of the parallel coupling MIM as illustrated in FIG. 17, so that the value of the parasitic capacitance with respect to the ground increases, and the first capacitance value of the first capacitor Cj of the parallel coupling MIM when the switch is turned off increases. Accordingly, the first capacitance difference between the first capacitance value when the switch is turned on and the first capacitance value when the switch is turned off is reduced, and the first capacitance difference and the second capacitance difference become closer to each other, so that the linearity of the capacitance value change of the variable capacitance circuit 30 can be improved. Further, when the relationship of LB2>LB1 is established, the distance LB2 becomes longer in the second capacitor Ci of the series coupling MIM as illustrated in FIG. 21, so that the value of the parasitic capacitance with respect to the ground is reduced, and the second capacitance value of the second capacitor Ci of the series coupling MIM when the switch is turned off is reduced. Accordingly, the second capacitance difference between the second capacitance value when the switch is turned on and the second capacitance value when the switch is turned off increases, and the first capacitance difference and the second capacitance difference become closer to each other, so that the linearity of the capacitance value change of the variable capacitance circuit 30 can be improved.

Further, as illustrated in FIGS. 17 and 18, the first electrode EDj of the first capacitor Cj of the parallel coupling MIM is an electrode coupled to, for example, the other end of the first switch SWj whose one end is coupled to the ground node NG. By doing in this manner, for example, by setting the shape pattern of the first electrode EDj or setting the first disposition relationship between the first electrode EDj and the first ground shield GSj, it is possible to increase the value of the parasitic capacitance with respect to the ground. For example, as illustrated in FIG. 17, by reducing the distances LA1 and LB1 between the first electrode EDj and the first ground shield GSj, it is possible to increase the value of the parasitic capacitance with respect to the ground, or as illustrated in FIG. 18, by forming the first electrode EDj and the first ground shield GSj into a comb-tooth shape, it is possible to increase the value of the parasitic capacitance with respect to the ground. By increasing the value of the parasitic capacitance of the first capacitor Cj to reduce the first capacitance difference of the first capacitor Cj in this way, it is possible to bring the first capacitance difference of the first capacitor Cj and the second capacitance difference of the second capacitor Ci close to each other, and the linearity of the capacitance value change of the variable capacitance circuit 30 can be improved. The first electrode of the first capacitor Cj of the parallel coupling MIM may be, for example, the first electrode EBj formed by the metal layer ALB, or the like. By doing in this manner, by setting the shape pattern of the first electrode EBj or setting the first disposition relationship between the first electrode EBj and the first ground shield GSj, the value of the parasitic capacitance with respect to the ground is increased, so that it is possible to bring the first capacitance difference and the second capacitance difference close to each other.

Further, as illustrated in FIGS. 20 and 21, the second electrode EBi of the second capacitor Ci of the series coupling MIM is an electrode coupled to, for example, the other end of the second switch SWi whose one end is coupled to the ground node NG. By doing in this manner, by setting the shape pattern of the second electrode EBi or setting the second disposition relationship between the second electrode EBi and the second ground shield GSi, for example, it is possible to reduce the value of the parasitic capacitance with respect to the ground. For example, as illustrated in FIGS. 20 and 21, by increasing the distances LA2 and LB2 between the second electrode EBi and the second ground shield GSi, or the like, it is possible to reduce the value of the parasitic capacitance with respect to the ground. By reducing the value of the parasitic capacitance of the second capacitor Ci to increase the second capacitance difference of the second capacitor Ci in this way, it is possible to bring the first capacitance difference of the first capacitor Cj and the second capacitance difference of the second capacitor Ci close to each other, and the linearity of the capacitance value change of the variable capacitance circuit 30 can be improved.

Further, as illustrated in FIG. 3, the second electrode of the second capacitor Ci of the series coupling MIM may be the second electrode ECi coupled to the intermediate coupling nodes of the plurality of MIM capacitors CM3 and CM4 coupled in series. That is, the second electrode may be the second electrode ECi formed by the metal layer ALC. By doing in this manner, by setting the shape pattern of the second electrode ECi or setting the second disposition relationship between the second electrode ECi and the second ground shield GSi, for example, it is possible to reduce the value of the parasitic capacitance with respect to the ground. For example, as illustrated in FIGS. 20 and 21, by increasing the distances LA2 and LB2 between the second electrode ECi and the second ground shield GSi, or the like, the value of the parasitic capacitance with respect to the ground is reduced, so that it is possible to bring the first capacitance difference and the second capacitance difference close to each other, and the linearity of the capacitance value change of the variable capacitance circuit 30 can be improved. The second electrode of the second capacitor Ci of the series coupling MIM may be, for example, the second electrode EDi formed by the metal layer ALD. By doing in this manner, by setting the shape pattern of the second electrode EDi or setting the second disposition relationship between the second electrode EDi and the second ground shield GSi, the value of the parasitic capacitance with respect to the ground is reduced, so that it is possible to bring the first capacitance difference and the second capacitance difference close to each other.

As illustrated in FIGS. 2, 17, and 18, the first capacitor Cj of the parallel coupling MIM includes the MIM capacitors CM1 and CM2 stacked in the direction in plan view and coupled in parallel. The CM1 is a first MIM capacitor, and CM2 is a second MIM capacitor. Further, as illustrated in FIGS. 3, 20, and 21, the second capacitor Ci of the series coupling MIM includes the MIM capacitors CM3 and CM4 stacked in the direction in plan view and coupled in series.

CM3 is a third MIM capacitor, and CM4 is a fourth MIM capacitor. In this way, by configuring the first capacitor Cj of the parallel coupling MIM with the MIM capacitors CM1 and CM2 stacked in the direction in plan view that is a vertical direction and configuring the second capacitor Ci of the series coupling MIM with the MIM capacitors CM3 and CM4 stacked in the direction in plan view, the first capacitor Cj and the second capacitor Ci can be realized with a small layout area. That is, by stacking the MIM capacitors in the direction in plan view that is a vertical direction, the first capacitor Cj of the parallel coupling MIM and the second capacitor Ci of the series coupling MIM can be realized while suppressing the increase in the area in the horizontal direction. Accordingly, the layout area of the variable capacitance circuit 30 can be reduced, and for example, the circuit device 20 including the variable capacitance circuit 30 as illustrated in FIG. 23 can be miniaturized.

Further, as illustrated in FIGS. 2 and 4, the first ground shield GSj surrounds the MIM capacitor CM1 and the MIM capacitor CM2 in plan view, and the second ground shield GSi surrounds the MIM capacitor CM3 and the MIM capacitor CM4 in plan view. By doing in this manner, the MIM capacitors CM1 and CM2 constituting the first capacitor Cj are surrounded by the first ground shield GSj, and the formation of the unnecessary parasitic capacitance between the MIM capacitors CM1 and CM2 and the outer member of the first ground shield GSj can be prevented. Further, the MIM capacitors CM3 and CM4 constituting the second capacitor Ci are surrounded by the second ground shield GSi, and the formation of the unnecessary parasitic capacitance between the MIM capacitors CM3 and CM4 and the outer member of the second ground shield GSi can be prevented.

Further, in the present embodiment, the capacitance values of the plurality of capacitors in the capacitor array of the variable capacitance circuit 30 are weighted in binary. Taking FIG. 8 as an example, the capacitors C7, C6, C5, C4, C3, C2, and C1 have capacitance values weighted in binary such as 8C, 4C, 2C, 1C, (1/2)×C, (1/4)×C, and (1/8)×C. By doing in this manner, it is possible to digitally adjust the capacitance value of the variable capacitance circuit 30 by the binary code of the control data DCN. The capacitor array 32 of the variable capacitance circuit 30 may include, for example, capacitors whose capacitance values are not weighted in binary, such as the capacitors C18 to C8 in FIG. 8.

Figure 22:
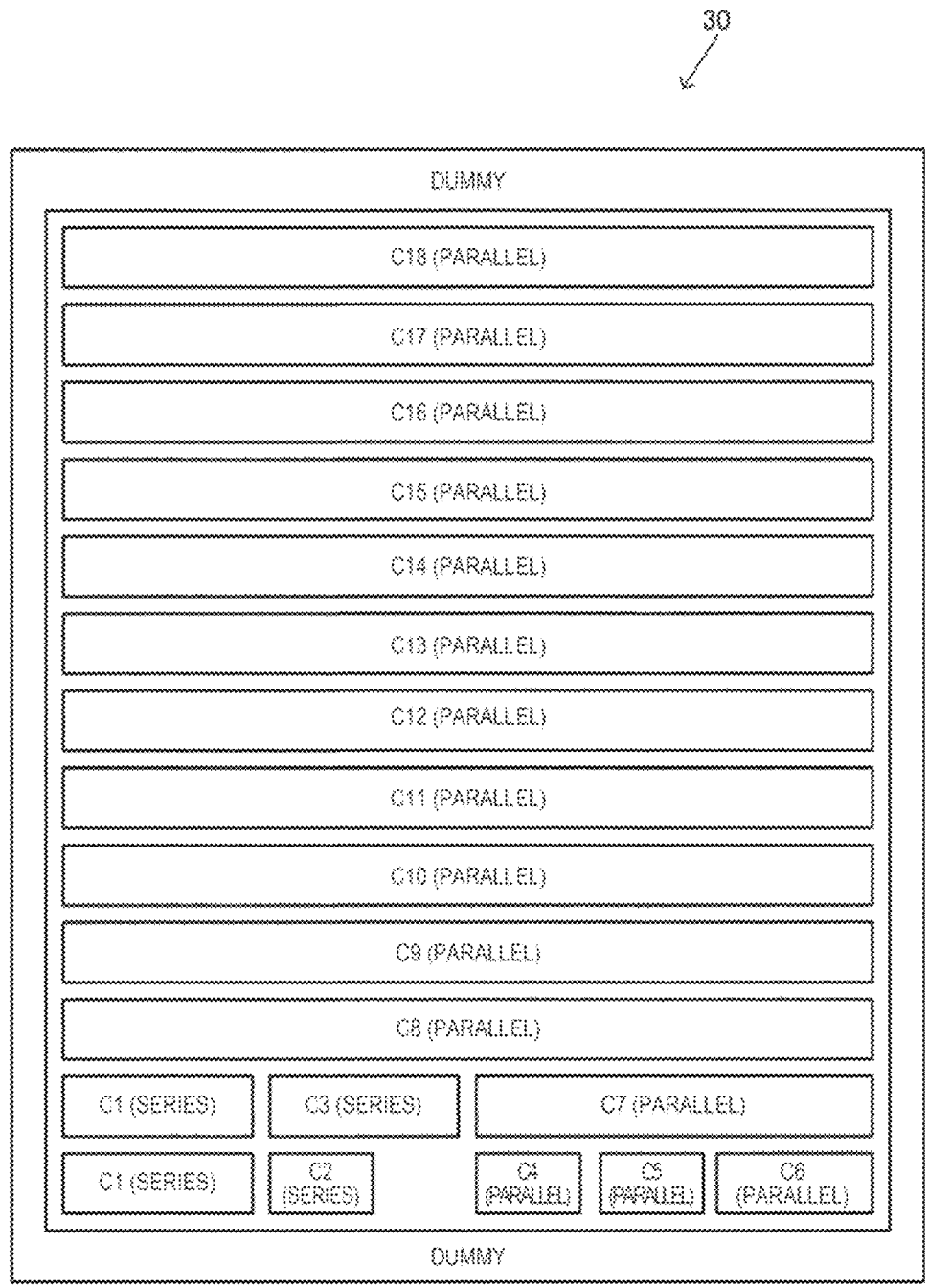
FIG. 22 is an example of an overall layout disposition of a variable capacitance circuit.

FIG. 22 illustrates an example of layout disposition of the variable capacitance circuit 30 of the present embodiment. For example, in FIG. 22, the capacitors C18 to C8 of the parallel coupling MIM are disposed side by side along the second direction DR2 with the first direction DR1 as the long side direction, for example. Further, for example, in the lower right direction on the paper surface of the capacitors C18 to C8 of the parallel coupling MIM, the capacitors C7 to C4 of the parallel coupling MIM are disposed, for example, with the first direction DR1 as the long side direction. Further, for example, in the lower left direction on the paper surface of the capacitors C18 to C8 of the parallel coupling MIM, the capacitors C3 to C1 of the series coupling MIM are disposed, for example, with the first direction DR1 as the long side direction. The capacitors C18 to C4 of the parallel coupling MIM are layout-disposed so that the distances LA1 and LB1 are small, for example, as illustrated in FIG. 17. On the other hand, the capacitors C1 to C3 of the series coupling MIM are layout-disposed so that the distances LA2 and LB2 are large, for example, as illustrated in FIGS. 20 and 21. That is, to establish the relationship of LA2>LA1 and LB2>LB1, layout disposition is performed.

3. Circuit Device

FIG. 23 illustrates a configuration example of the circuit device 20 of the present embodiment. The circuit device 20 of the present embodiment includes an oscillation circuit 40. Further, the circuit device 20 can include an output buffer circuit 50, a power supply circuit 60, a power supply pad PVDD, a ground pad PGND, a clock pad PCK, and pads PX1 and PX2 for coupling a resonator. Further, the oscillator 4 of the present embodiment includes a resonator 10 and the circuit device 20. The resonator 10 is electrically coupled to the circuit device 20. For example, the resonator 10 and the circuit device 20 are electrically coupled to each other by using the internal wiring of the package for accommodating the resonator 10 and the circuit device 20, a bonding wire, a metal bump, or the like.

The resonator 10 is an element that generates mechanical vibration by an electric signal. The resonator 10 can be realized, for example, by a resonator element such as a quartz crystal resonator element. For example, the resonator 10 can be implemented by a quartz crystal resonator element that performs thickness shear vibration with a cut angle such as AT cut or SC cut, a tuning fork type quartz crystal resonator element, or a dual tuning fork type quartz crystal resonator element, or the like. For example, the resonator 10 may be a resonator built in a temperature compensated crystal oscillator (TCXO) not provided with a constant temperature bath, or may be a resonator built in a constant temperature bath type quartz crystal oscillator (OCXO) provided with a constant temperature bath. Alternatively, the resonator 10 may be a resonator built in a oscillator of the simple packaged crystal oscillator (SPXO). The resonator 10 of the present embodiment can also be realized by various resonator elements, for example, such as a resonator element other than a thickness shear vibration type, a tuning fork type, or a dual tuning fork type and a piezoelectric resonator element made of a material other than quartz crystal. For example, as the resonator 10, a surface acoustic wave (SAW) resonator, a micro electro mechanical systems (MEMS) resonator as a silicon resonator formed by using a silicon substrate, or the like may be adopted.

The circuit device 20 is, for example, an integrated circuit (IC) manufactured by a semiconductor process, and is a semiconductor chip in which circuit elements are formed on a semiconductor substrate. In FIG. 23, the circuit device 20 includes the oscillation circuit 40, the output buffer circuit 50, and the power supply circuit 60.

The oscillation circuit 40 is a circuit that oscillates the resonator 10. For example, the oscillation circuit 40 is electrically coupled to the pads PX1 and PX2, and oscillates the resonator 10 to generate an oscillation signal OSC. The pad PX1 is the first pad, and the pad PX2 is the second pad. For example, the oscillation circuit 40 can be realized by a drive circuit for oscillation provided between the pad PX1 and the pad PX2 and active elements such as a capacitor or a resistor. The drive circuit can be realized by, for example, a CMOS inverter circuit or a bipolar transistor. The drive circuit is a core circuit of the oscillation circuit 40, and the drive circuit oscillates the resonator 10 by driving the resonator 10 with a voltage or a current. As the oscillation circuit 40, various types of oscillation circuits, for example, such as an inverter type, a Pierce type, a Colpitts type, and a Hartley type can be used.

The output buffer circuit 50 outputs a clock signal CKQ based on the oscillation signal OSC. For example, the output buffer circuit 50 buffers the oscillation signal OSC and outputs the oscillation signal OSC as the clock signal CKQ to the clock pad PCK. The clock signal CKQ is output to the outside via the external terminal TCK of the oscillator 4. For example, the output buffer circuit 50 outputs the clock signal CKQ in a single-ended CMOS signal format. The output buffer circuit 50 may output the clock signal CKQ in a signal format other than CMOS. For example, the output buffer circuit 50 may output a differential clock signal to the outside in a signal format such as low voltage differential signaling (LVDS), positive emitter coupled logic (PECL), high speed current steering logic (HCSL), or differential complementary MOS (CMOS).

The power supply circuit 60 is supplied with a power supply voltage VDD from the power supply pad PVDD and the ground voltage from the ground pad PGND to supply various power supply voltages for the internal circuit of the circuit device 20 to the internal circuit. For example, the power supply circuit 60 supplies a regulated power supply voltage based on the power supply voltage VDD to the oscillation circuit 40 or the like. For example, the power supply circuit includes a regulator, and the regulator generates a regulated power supply voltage. Further, the power supply circuit 60 can include a reference voltage generation circuit that generates a reference voltage used for generating a bias current, a bias voltage, a regulated power supply voltage, or the like.

Further, the circuit device 20 includes the power supply pad PVDD, the ground pad PGND, the clock pad PCK, and the pads PX1 and PX2 for coupling a resonator. These pads are, for example, terminals of the circuit device 20 which is a semiconductor chip. For example, in the pad area, a metal layer is exposed from a passivation film that is an insulating layer, and the exposed metal layer constitutes the pads of the circuit device 20. The power supply pad PVDD is a pad to which the power supply voltage VDD is input. For example, the power supply voltage VDD from an external power supply device is supplied to the power supply pad PVDD. The ground pad PGND is a terminal to which the GND that is a ground voltage is supplied. The GND can also be called VSS, and the ground voltage is, for example, the ground potential. The clock pad PCK is a pad that outputs the clock signal CKQ. For example, the clock signal CKQ based on the oscillation signal OSC in the oscillation circuit 40 is output from the clock pad PCK to the outside. The power supply pad PVDD, the ground pad PGND, and the clock pad PCK are electrically coupled to the external terminals TVDD, TGND, and TCK for external coupling of the oscillator 4, respectively. For example, the internal wiring of the package, a bonding wire, a metal bump, or the like are used for electrically coupling. The external terminals TVDD, TGND, and TCK of the oscillator 4 are electrically coupled to the external device. Further, the pads PX1 and PX2 are pads for coupling the resonator 10. For example, the pad PX1 is electrically coupled to one end of the resonator 10, and the pad PX2 is electrically coupled to the other end of the resonator 10. For example, the resonator 10 and the pads PX1 and PX2 of the circuit device 20 are electrically coupled by using the internal wiring of the package accommodating the resonator 10 and the circuit device 20, a bonding wire, a metal bump, or the like.

The oscillation circuit 40 includes the variable capacitance circuit 30, and the oscillation frequency can be adjusted by adjusting the capacitance of the variable capacitance circuit 30. The variable capacitance circuit 30 is realized by the capacitor array 32 and the switch array 34 provided in series with the capacitor array 32, as described with reference to FIGS. 1 and 8. That is, the variable capacitance circuit 30 is constituted with the capacitor array 32 having a plurality of capacitors whose capacitance values are weighted in binary, and the switch array 34 having a plurality of switches in which each switch turns on and off the coupling between each capacitor in the capacitor array and the ground node NG. The coupling in the present embodiment is electrical coupling. The electrical coupling is a coupling in which an electric signal can be transmitted, and is a coupling in which information can be transmitted by the electric signal. The electrical coupling may be a coupling via a passive element or the like.

As described above, the circuit device 20 of the present embodiment includes the oscillation circuit 40 having the variable capacitance circuit 30, and the oscillation frequency of the oscillation circuit 40 is controlled by the capacitance value of the variable capacitance circuit 30. The first node N1 described with reference to FIGS. 1, 8, and so on is an oscillation node of the oscillation circuit 40. For example, the first node N1 is a node to which the pad PX1 or the pad PX2 is coupled, and a node to which one end or the other end of the resonator 10 is electrically coupled. By providing the variable capacitance circuit 30 such that the first node N1 becomes the oscillation node of the oscillation circuit 40 in this way, the capacitance value of the variable capacitance circuit 30 is controlled based on the control data DCN, so that the oscillation frequency of the oscillation circuit 40 can be controlled. Accordingly, for example, it is possible to realize the temperature compensation processing of the oscillation frequency, fine adjusting processing of the oscillation frequency, or the like. As the variable capacitance circuit 30, a first variable capacitance circuit coupled to the pad PX1 and a second variable capacitance circuit coupled to the pad PX2 may be provided.

4. Oscillator

Figure 24:
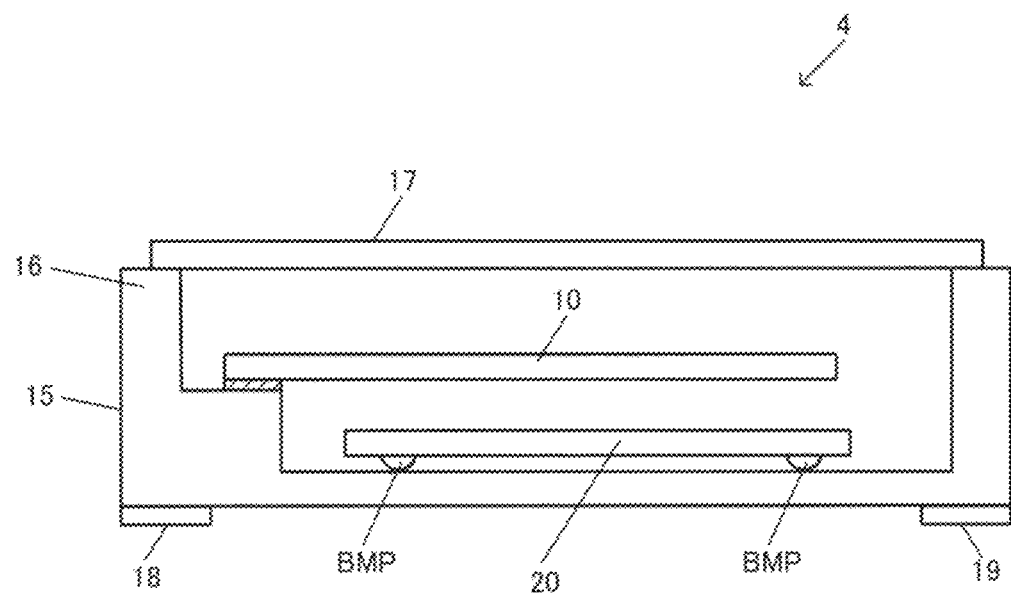
FIG. 24 is a structural example of an oscillator.

FIG. 24 illustrates a structural example of the oscillator 4 of the present embodiment. The oscillator 4 of the present embodiment includes the circuit device 20 and the resonator 10 that oscillates by being driven by an oscillation circuit 40 of the circuit device 20. Specifically, the oscillator 4 has the resonator 10, the circuit device 20, and a package 15 that houses the resonator 10 and the circuit device 20. The package 15 is formed of, for example, ceramic or the like, and has a housing space inside, and the resonator 10 and the circuit device 20 are housed in this housing space. The housing space is hermetically sealed and is preferably in a decompressed state, which is close to vacuum. The package 15 can suitably protect the resonator 10 and the circuit device 20 from impact, dust, heat, humidity, or the like.

Package 15 has a base 16 and a lid 17. Specifically, the package 15 is constituted with the base 16 that supports the resonator 10 and the circuit device 20, and the lid 17 that is joined to the upper surface of the base 16 to form a housing space between the lid and the base 16. The resonator 10 is supported by a step portion provided inside the base 16 via a terminal electrode. Further, the circuit device 20 is disposed on the inner bottom surface of the base 16. Specifically, the circuit device 20 is disposed so that the active surface faces the inner bottom surface of the base 16. The active surface is a surface on which the circuit elements of the circuit device 20 are formed. Further, bumps BMP are formed on pads which are terminals of the circuit device 20. The circuit device 20 is supported on the inner bottom surface of the base 16 via the conductive bumps BMP. The conductive bump BMP is, for example, a metal bump, and the resonator 10 and the circuit device 20 are electrically coupled via the bumps BMP, the internal wiring and the terminal electrode of the package 15, or the like. Further, the circuit device 20 is electrically coupled to external terminals 18 and 19 that are the external coupling terminals of the oscillator 4 via the bumps BMP and the internal wiring of the package 15. The external terminals 18 and 19 are formed on the outer bottom surface of the package 15. The external terminals 18 and 19 are coupled to an external device via external wiring. The external wiring is, for example, the wiring formed on a circuit substrate on which an external device is mounted, or the like. Accordingly, it is possible to output a clock signal or the like to an external device.

In FIG. 24, the circuit device 20 is flip-mounted so that the active surface of the circuit device 20 faces downward, but the present embodiment is not limited to such mounting. For example, the circuit device 20 may be mounted so that the active surface of the circuit device 20 faces upward. That is, the circuit device 20 is mounted so that the active surface faces the resonator 10. Alternatively, the oscillator 4 may be a wafer level package (WLP) oscillator. In this case, the oscillator 4 includes a semiconductor substrate, a base having a through electrode penetrating between the first and second surfaces of the semiconductor substrate, the resonator 10 fixed via a conductive bonding member such as a metal bump with respect to the first surface of the semiconductor substrate, and an external terminal provided on the side of the second surface of the semiconductor substrate via an insulating layer such as a re-disposition wiring layer. An integrated circuit serving as the circuit device 20 is formed on the first surface or the second surface of the semiconductor substrate. In this case, by attaching the first semiconductor wafer on which a plurality of bases on which the resonator 10 and the integrated circuit are disposed are formed and the second semiconductor wafer on which a plurality of lids are formed, the plurality of bases and the plurality of lids are joined, and then the oscillator 4 is separated by a dicing saw or the like. By doing in this manner, the oscillator 4 in the wafer level package can be realized, and the oscillator 4 can be manufactured with high throughput and low cost.

As described above, the variable capacitance circuit of the present embodiment whose capacitance value is variably controlled based on control data, includes a capacitor array including a plurality of capacitors and a switch array having a plurality of switches that are turned on or off based on the control data and provided in series with the capacitor array between a first node and a ground node. The capacitor array includes a first capacitor in which a plurality of MIM capacitors are coupled in parallel, and a second capacitor in which a plurality of MIM capacitors are coupled in series. Further, the switch array includes a first switch coupled in series with the first capacitor between the first node and the ground node, and a second switch coupled in series with the second capacitor between the first node and the ground node. A capacitance value between the first node and the ground node due to the first capacitor and a parasitic capacitance of the first capacitor is defined as a first capacitance value, and a capacitance value between the first node and the ground node due to the second capacitor and a parasitic capacitance of the second capacitor is defined as a second capacitance value. Further, a first capacitance difference per 1 LSB of the control data between the first capacitance value when the first switch is turned on and the first capacitance value when the first switch is turned off is defined, and a second capacitance difference per 1 LSB of the control data between the second capacitance value when the second switch is turned on and the second capacitance value when the second switch is turned off is defined. At this time, in plan view, a shape pattern of at least one of a first electrode that is an electrode of the first capacitor, a first ground shield surrounding the first capacitor, a second electrode that is an electrode of the second capacitor, and a second ground shield surrounding the second capacitor is set so that the first capacitance difference and the second capacitance difference are close to each other.

The variable capacitance circuit of the present embodiment in this way includes the capacitor array having the first capacitor in which a plurality of MIM capacitors are coupled in parallel and the second capacitor in which a plurality of MIM capacitors are coupled in series, and the switch array having the first switch and the second switch. A shape pattern of at least one of the first electrode of the first capacitor, the first ground shield, the second electrode of the second capacitor, and the second ground shield is set so that the first capacitance difference per 1 LSB between the first capacitance values of the first capacitor when the first switch is turned on and off and the second capacitance difference per 1 LSB between the second capacitance values of the second capacitor when the second switch is turned on and off are close to each other. By doing in this manner, by setting the shape pattern of the first electrode, the first ground shield, the second electrode, or the second ground shield to a predetermined shape pattern, it is possible to bring the first capacitance difference and the second capacitance difference close to each other, and when the first capacitance difference and the second capacitance difference are close to each other, the deterioration of the linearity of the capacitance value change can be suppressed. Accordingly, it is possible to provide a variable capacitance circuit or the like that can improve the linearity of the capacitance value change.

Further, in the present embodiment, at least one of a first disposition relationship between the first electrode and the first ground shield and a second disposition relationship between the second electrode and the second ground shield may be set so that the first capacitance difference and the second capacitance difference are close to each other.

By doing in this manner, by setting the first disposition relationship between the first electrode and the first ground shield and the second disposition relationship between the second electrode and the second ground shield to a predetermined disposition relationship, it is possible to bring the first capacitance difference and the second capacitance difference close to each other, and when the first capacitance difference and the second capacitance difference are brought close to each other, the linearity of the capacitance value change of the variable capacitance circuit can be improved.

Further, in the present embodiment, in plan view, when a distance in a first direction between the first electrode and the first ground shield is defined as LA1 and a distance in the first direction between the second electrode and the second ground shield is defined as LA2, LA2>LA1 may be satisfied.

By doing in this manner, in the first capacitor, the distance LA1 in the first direction between the first electrode and the first ground shield becomes shorter, so that the value of the parasitic capacitance with respect to the ground increases, and in the second capacitor, the distance LA2 in the first direction between the second electrode and the second ground shield becomes longer, so that the value of the parasitic capacitance with respect to the ground is reduced. Accordingly, the first capacitance difference of the first capacitor and the second capacitance difference of the second capacitor become close to each other, and the linearity of the capacitance value change of the variable capacitance circuit can be improved.

Further, the variable capacitance circuit of the present embodiment whose capacitance value is variably controlled based on control data includes a capacitor array including a plurality of capacitors and a switch array having a plurality of switches that are turned on or off based on the control data and provided in series with the capacitor array between a first node and a ground node. The capacitor array includes a first capacitor in which a plurality of MIM capacitors are coupled in parallel, and a second capacitor in which a plurality of MIM capacitors are coupled in series. Further, the switch array includes a first switch coupled in series with the first capacitor between the first node and the ground node, and a second switch coupled in series with the second capacitor between the first node and the ground node. In plan view, when the distance in the first direction between the first electrode of the first capacitor and the first ground shield surrounding the first capacitor is defined as LA1, and the distance in the first direction between the second electrode of the second capacitor and the second ground shield surrounding the second capacitor is defined as LA2, it is LA2>LA1.

The variable capacitance circuit of the present embodiment in this way includes the capacitor array having the first capacitor in which a plurality of MIM capacitors are coupled in parallel and the second capacitor in which a plurality of MIM capacitors are coupled in series, and the switch array having the first switch and the second switch. For the distance LA1 in the first direction between the first electrode of the first capacitor and the first ground shield and the distance LA2 in the first direction between the second electrode of the second capacitor and the second ground shield, the relationship of LA2>LA1 is established. By doing in this manner, in the first capacitor, the distance LA1 in the first direction between the first electrode and the first ground shield becomes shorter, so that the value of the parasitic capacitance with respect to the ground increases, and in the second capacitor, the distance LA2 in the first direction between the second electrode and the second ground shield becomes longer, so that the value of the parasitic capacitance with respect to the ground is reduced. Accordingly, the first capacitance difference of the first capacitor and the second capacitance difference of the second capacitor become close to each other, and the linearity of the capacitance value change of the variable capacitance circuit can be improved.

Further, in the present embodiment, when a direction orthogonal to the first direction is defined as a second direction and in plan view, when a distance in the second direction between the first electrode and the first ground shield is defined as LB1 and a distance in the second direction between the second electrode and the second ground shield is defined as LB2, it may be LB2>LB1.

By doing in this manner, in the first capacitor, the distance LB1 in the second direction between the first electrode and the first ground shield becomes shorter, so that the value of the parasitic capacitance with respect to the ground increases, and in the second capacitor, the distance LB2 in the second direction between the second electrode and the second ground shield becomes longer, so that the value of the parasitic capacitance with respect to the ground is reduced. Accordingly, the first capacitance difference of the first capacitor and the second capacitance difference of the second capacitor become close to each other, and the linearity of the capacitance value change of the variable capacitance circuit can be improved.

Further, in the present embodiment, the first electrode may have a first portion having a convex shape in plan view and a second portion having a convex shape in plan view, and the first ground shield may have a third portion having a side surface facing the side surface of the first portion and having a concave shape in plan view and a fourth portion having a side surface facing the side surface of the second portion and having a concave shape in plan view.

By doing in this manner, in the first capacitor, the value of the parasitic capacitance with respect to the ground is increased by increasing the facing area of the side surface of the first ground shield facing the side surface of the first electrode, so that it is possible to bring the first capacitance difference of the first capacitor and the second capacitance difference of the second capacitor close to each other.

Further, the first electrode may be an electrode coupled to the other end of the first switch whose one end is coupled to the ground node.

By doing in this manner, by increasing the value of the parasitic capacitance with respect to the ground by setting the shape pattern of the first electrode of the first capacitor or setting the first disposition relationship between the first electrode and the first ground shield, it is possible to bring the first capacitance difference of the first capacitor and the second capacitance difference of the second capacitor close to each other.

Further, in the present embodiment, the second electrode may be an electrode coupled to the other end of the second switch whose one end is coupled to the ground node.

By doing in this manner, by reducing the value of the parasitic capacitance with respect to the ground by setting the shape pattern of the second electrode of the second capacitor or setting the second disposition relationship between the second electrode and the second ground shield, it is possible to bring the first capacitance difference of the first capacitor and the second capacitance difference of the second capacitor close to each other.

Further, in the present embodiment, the second electrode may be an electrode coupled to an intermediate coupling node of a plurality of MIM capacitors coupled in series.

By doing in this manner, by reducing the value of the parasitic capacitance with respect to the ground by setting the shape pattern of the second electrode of the second capacitor or setting the second disposition relationship between the second electrode and the second ground shield, it is possible to bring the first capacitance difference of the first capacitor and the second capacitance difference of the second capacitor close to each other.

Further, in the present embodiment, the first capacitor may include a first MIM capacitor and a second MIM capacitor stacked and coupled in parallel in the direction in plan view, and the second capacitor may include a third MIM capacitor and a fourth MIM capacitor stacked and coupled in series in the direction in plan view.

In this way, when the first MIM capacitor and the second MIM capacitor stacked in the direction in plan view constitute the first capacitor, and the third MIM capacitor and the fourth MIM capacitor stacked in the direction in plan view constitute the second capacitor, the first capacitor and the second capacitor can be realized with a small layout area.

Further, in the present embodiment, the first ground shield may surround the first MIM capacitor and the second MIM capacitor in plan view, and the second ground shield may surround the third MIM capacitor and the fourth MIM capacitor in plan view.

By doing in this manner, the first MIM capacitor and the second MIM capacitor constituting the first capacitor are surrounded by the first ground shield, and the third MIM capacitor and the fourth MIM capacitor constituting the second capacitor are surrounded by the second ground shield, so that it is possible to prevent unnecessary parasitic capacitance from being formed between the capacitors and the outer member of the first ground shield and the second ground shield.

Further, in the present embodiment, the capacitance values of the plurality of capacitors in the capacitor array may be weighted in binary.

By doing in this manner, it is possible to digitally adjust the capacitance value of the variable capacitance circuit by the binary code of the control data.

Further, the present embodiment may include an oscillation circuit having the variable capacitance circuit described above, in which the oscillation frequency of the oscillation circuit may be controlled by the capacitance value of the variable capacitance circuit, and the first node may be an oscillation node of the oscillation circuit.

Further, in the present embodiment, a circuit device includes the variable capacitance circuit described above and the oscillation circuit whose oscillation frequency is controlled by the capacitance value of the variable capacitance circuit, in which the first node is an oscillation node of the oscillation circuit.

By providing the variable capacitance circuit such that the first node becomes the oscillation node of the oscillation circuit in this way, the oscillation frequency of the oscillation circuit can be controlled by controlling the capacitance value of the variable capacitance circuit based on the control data.

Further, in the present embodiment, an oscillator includes the circuit device described above and a resonator that oscillates by being driven by the oscillation circuit.

Although the present embodiment has been described in detail as described above, those skilled in the art can easily understand that many modifications that do not substantially deviate from the novel matters and effects of the present disclosure are possible. Accordingly, all such modification examples are included in the scope of the present disclosure. For example, a term described at least once in a specification or drawing with a different term in a broader or synonymous manner can be replaced by that different term anywhere in the specification or drawing. All combinations of the present embodiment and modification example are also included in the scope of the present disclosure. Further, the configuration and operation of the variable capacitance circuit, the circuit device, and the oscillator are also not limited to those described in the present embodiment, and various modifications can be performed.

What is claimed is:

1. A variable capacitance circuit whose capacitance value is variably controlled based on control data, the variable capacitance circuit comprising:
   a capacitor array including a plurality of capacitors; and
   a switch array having a plurality of switches that are turned on or off based on the control data and provided in series with the capacitor array between a first node and a ground node, wherein
   the capacitor array includes a first capacitor in which a plurality of metal-insulator-metal (MIM) capacitors are coupled in parallel, and a second capacitor in which a plurality of MIM capacitors are coupled in series,
   the switch array includes a first switch coupled in series with the first capacitor between the first node and the ground node and a second switch coupled in series with the second capacitor between the first node and the ground node, and
   when a capacitance value between the first node and the ground node due to the first capacitor and a parasitic capacitance of the first capacitor is defined as a first capacitance value, and a capacitance value between the first node and the ground node due to the second capacitor and a parasitic capacitance of the second capacitor is defined as a second capacitance value,
   in plan view, a shape pattern of at least one of a first electrode that is an electrode of the first capacitor, a first ground shield surrounding the first capacitor, a second electrode that is an electrode of the second capacitor, and a second ground shield surrounding the second capacitor is set
   so that a first capacitance difference per 1 LSB of the control data between the first capacitance value when the first switch is turned on and the first capacitance value when the first switch is turned off and a second capacitance difference per 1 LSB of the control data between the second capacitance value when the second switch is turned on and the second capacitance value when the second switch is turned off are close to each other.

2. The variable capacitance circuit according to claim 1, wherein
   at least one of a first disposition relationship between the first electrode and the first ground shield and a second disposition relationship between the second electrode and the second ground shield is set
   so that the first capacitance difference and the second capacitance difference are close to each other.

3. The variable capacitance circuit according to claim 1, wherein
   in the plan view, when a distance in a first direction between the first electrode and the first ground shield is defined as LA1 and a distance in the first direction between the second electrode and the second ground shield is defined as LA2,
   LA2>LA1.

4. A variable capacitance circuit whose capacitance value is variably controlled based on control data, the variable capacitance circuit comprising:
   a capacitor array including a plurality of capacitors; and
   a switch array having a plurality of switches that are turned on or off based on the control data and provided in series with the capacitor array between a first node and a ground node, wherein
   the capacitor array includes a first capacitor in which a plurality of MIM capacitors are coupled in parallel, and a second capacitor in which a plurality of MIM capacitors are coupled in series,
   the switch array includes a first switch coupled in series with the first capacitor between the first node and the ground node and a second switch coupled in series with the second capacitor between the first node and the ground node, and
   in plan view, when a distance in a first direction between a first electrode of the first capacitor and a first ground shield surrounding the first capacitor is defined as LA1 and a distance in the first direction between a second electrode of the second capacitor and a second ground shield surrounding the second capacitor is defined as LA2,
   LA2>LA1.

5. The variable capacitance circuit according to claim 3, wherein
   when a direction orthogonal to the first direction is defined as a second direction, and in the plan view, when a distance in the second direction between the first electrode and the first ground shield is defined as LB1 and a distance in the second direction between the second electrode and the second ground shield is defined as LB2,

LB2>LB1.

6. The variable capacitance circuit according to claim 1, wherein
the first electrode has a first portion having a convex shape in the plan view and a second portion having a convex shape in the plan view, and
the first ground shield has a third portion having a side surface facing a side surface of the first portion and having a concave shape in the plan view and a fourth portion having a side surface facing a side surface of the second portion and having a concave shape in the plan view.

7. The variable capacitance circuit according to claim 1, wherein
the first electrode is an electrode coupled to one end of the first switch whose other end is coupled to the ground node.

8. The variable capacitance circuit according to claim 7, wherein
the second electrode is an electrode coupled to one end of the first switch whose other end is coupled to the ground node.

9. The variable capacitance circuit according to claim 7, wherein
the second electrode is an electrode coupled to an intermediate coupling node of the plurality of MIM capacitors coupled in series.

10. The variable capacitance circuit according to claim 1, wherein
the first capacitor includes a first MIM capacitor and a second MIM capacitor stacked and coupled in parallel in a direction in the plan view, and
the second capacitor includes a third MIM capacitor and a fourth MIM capacitor stacked and coupled in series in the direction in the plan view.

11. The variable capacitance circuit according to claim 10, wherein
the first ground shield surrounds the first MIM capacitor and the second MIM capacitor in the plan view, and
the second ground shield surrounds the third MIM capacitor and the fourth MIM capacitor in the plan view.

12. The variable capacitance circuit according to claim 1, wherein
capacitance values of the plurality of capacitors in the capacitor array are weighted in binary.

13. A circuit device comprising:
an oscillation circuit having the variable capacitance circuit according to claim 1, wherein
an oscillation frequency of the oscillation circuit is controlled by the capacitance value of the variable capacitance circuit, and
the first node is an oscillation node of the oscillation circuit.

14. An oscillator comprising:
the circuit device according to claim 13; and
a resonator that oscillates by being driven by the oscillation circuit.

* * * * *